(12) United States Patent
Mitani et al.

(10) Patent No.: US 10,775,168 B2
(45) Date of Patent: Sep. 15, 2020

(54) SENSOR DEVICE, GYRO SENSOR, AND ELECTRONIC APPARATUS

(71) Applicant: SONY CORPORATION, Tokyo (JP)

(72) Inventors: Satoshi Mitani, Kanagawa (JP);
Hidetoshi Kabasawa, Kanagawa (JP);
Kazuo Takahashi, Kanagawa (JP);
Hideo Niikura, Tokyo (JP)

(73) Assignee: SONY CORPORATION, Tokyo (JP)

( * ) Notice: Subject to any disclaimer, the term of this patent is extended or adjusted under 35 U.S.C. 154(b) by 560 days.

(21) Appl. No.: 15/528,860

(22) PCT Filed: Oct. 20, 2015

(86) PCT No.: PCT/JP2015/005278
§ 371 (c)(1),
(2) Date: Sep. 25, 2017

(87) PCT Pub. No.: WO2016/088291
PCT Pub. Date: Jun. 9, 2016

(65) Prior Publication Data
US 2018/0017386 A1    Jan. 18, 2018

(30) Foreign Application Priority Data

Dec. 1, 2014 (JP) ................................. 2014-243263

(51) Int. Cl.
*G01C 19/5656* (2012.01)
*G01C 19/5677* (2012.01)
*H01L 41/113* (2006.01)

(52) U.S. Cl.
CPC ..... *G01C 19/5656* (2013.01); *G01C 19/5677* (2013.01); *H01L 41/1132* (2013.01)

(58) Field of Classification Search
CPC ............ G01C 19/5642; G01C 19/5656; G01C 19/5663

(Continued)

(56) References Cited

U.S. PATENT DOCUMENTS

| 5,371,653 A | 12/1994 | Kametani et al. |
| 2002/0050148 A1* | 5/2002 | Shyy ...................... F25B 39/04 62/498 |

(Continued)

FOREIGN PATENT DOCUMENTS

| CN | 1906462 A | 1/2007 |
| CN | 102334008 A | 1/2012 |

(Continued)

OTHER PUBLICATIONS

Office Action for JP Patent Application No. 2016-562200, dated Jul. 2, 2019, 06 pages of Office Action and 06 pages of English Translation.

(Continued)

*Primary Examiner* — Nathaniel J Kolb
(74) *Attorney, Agent, or Firm* — Chip Law Group

(57) ABSTRACT

Provided is a sensor device that includes a vibrator unit, an annular base portion, a plurality of coupling portions, and a wiring layer. The wiring layer includes a plurality of drive wirings and a plurality of detection wirings. The plurality of drive wirings are respectively connected to first and second drive electrodes while being adjacent and parallel to one another. The plurality of detection wirings are respectively connected to first and second detection electrodes while being adjacent and parallel to one another. The wiring layer is provided at each of the plurality of coupling portions to electrically connect a plurality of terminal portions provided in the base portion with a plurality of piezoelectric drive units and first and second piezoelectric detection units provided in the vibrator unit.

13 Claims, 14 Drawing Sheets

(58) Field of Classification Search
USPC .......................................... 73/514.01–514.38
See application file for complete search history.

(56) References Cited

U.S. PATENT DOCUMENTS

| | | | | |
|---|---|---|---|---|
| 2006/0197414 | A1* | 9/2006 | Takahashi | G01C 19/5663 |
| | | | | 310/348 |
| 2008/0229822 | A1 | 9/2008 | Kato | |
| 2010/0011859 | A1* | 1/2010 | Terada | G01C 19/5607 |
| | | | | 73/504.16 |
| 2011/0296914 | A1* | 12/2011 | Takahashi | G01C 19/5747 |
| | | | | 73/504.15 |
| 2013/0083378 | A1 | 4/2013 | Tanaka et al. | |
| 2018/0017386 | A1 | 1/2018 | Mitani et al. | |

FOREIGN PATENT DOCUMENTS

| | | |
|---|---|---|
| CN | 103033928 A | 4/2013 |
| DE | 102012216506 A1 | 4/2013 |
| EP | 378211 A2 | 7/1990 |
| EP | 1734338 A1 | 12/2006 |
| EP | 2056069 A1 | 5/2009 |
| EP | 2392897 A1 | 12/2011 |
| JP | 02-186694 A | 7/1990 |
| JP | 2-186694 A | 7/1990 |
| JP | 10-308451 A | 11/1998 |
| JP | 2004-247615 A | 9/2004 |
| JP | 4858662 B2 | 1/2012 |
| JP | 2012-198099 A | 10/2012 |
| JP | 2013-2981 A | 1/2013 |
| JP | 2013-002981 A | 1/2013 |
| JP | 2013-92750 A | 5/2013 |
| JP | 2013-092750 A | 5/2013 |
| KR | 10-2012-0104919 A | 9/2012 |
| WO | 2005/098359 A1 | 10/2005 |
| WO | 2008/035683 A1 | 3/2008 |

OTHER PUBLICATIONS

International Search Report and Written Opinion of PCT Application No. PCT/JP2015/005278, dated Nov. 24, 2015, 11 pages of English Translation and 09 pages of ISRWO.

International Preliminary Report on Patentability of PCT Application No. PCT/JP2015/005278, dated Jun. 15, 2017, 12 pages of English Translation and 06 pages of IPRP.

Office Action for CN Patent Application No. 201580064373.8, dated Jan. 22, 2020, 11 pages of Office Action and 07 pages of English Translation.

* cited by examiner

⇒ Vibration direction
→ Coriolis force

SENSOR DEVICE, GYRO SENSOR, AND ELECTRONIC APPARATUS

CROSS REFERENCE TO RELATED APPLICATIONS

This application is a U.S. National Phase of International Patent Application No. PCT/JP2015/005278 filed on Oct. 20, 2015, which claims priority benefit of Japanese Patent Application No. JP 2014-243263 filed in the Japan Patent Office on Dec. 1, 2014. Each of the above-referenced applications is hereby incorporated herein by reference in its entirety.

TECHNICAL FIELD

The present technology relates to a sensor device, a gyro sensor, and an electronic apparatus capable of detecting angular velocities about 3 axes orthogonal to one another.

BACKGROUND ART

Vibration-type gyro sensors are widely used as an angular velocity sensor for consumer use. The vibration-type gyro sensor detects an angular velocity by causing a vibrator to vibrate at a predetermined frequency and detecting a Coriolis force generated in the vibrator using a piezoelectric device and the like. The gyro sensor is mounted on electronic apparatuses such as a video camera, a virtual reality apparatus, a car navigation system, and a wearable apparatus and is used as sensors for detecting hand movements, operations, directions, postures, and the like.

For example, Patent Literature 1 discloses an angular velocity sensor that includes an annular frame and a plurality of pendulum portions having one ends thereof connected to the frame and is capable of detecting angular velocities about 3 axes orthogonal to one another on the basis of a deformation amount of the frame and plurality of vibrators vibrating at a predetermined frequency.

Typically, in the vibration-type gyro sensor, a drive electrode for causing the vibrator to vibrate using an inverse piezoelectric effect and a detection electrode for detecting a deformation of the vibrator using a piezoelectric effect are each provided on a front surface of the vibrator. Wirings respectively connected to the drive electrode and the detection electrode are formed on the front surface of the vibrator.

For example, Patent Literature 2 discloses an angular velocity sensor device in which a plurality of wiring patterns are formed on a front surface of a twist extension portion that connects a fixed portion and a drive vibration body. In a wiring layout disclosed in Patent Literature 2, a plurality of detection wiring patterns are arranged between a pair of drive wiring patterns. Therefore, noises are apt to enter the detection wiring patterns from the drive wiring patterns, thus leading to a fear of inducing angular velocity detection accuracy. This problem may become more prominent as the device becomes smaller.

As a countermeasure for noises, for example, Patent Literature 3 discloses an angular velocity sensor in which a ratio of amplitudes of two drive signals is set to become an inverse ratio with respect to a ratio of parasitic capacitances caused between two drive electrodes and detection electrodes. Accordingly, noise components generated due to capacitance coupling between the first and second drive electrodes and detection electrodes are offset, and detection accuracy of angular velocity sensor signals is assumed to be improved. However, the angular velocity sensor disclosed in Patent Literature 3 presupposes a single angular velocity detection axis and thus cannot cope with a case where there are a plurality of detection signals like the angular velocity sensors disclosed in Patent Literatures 1 and 2.

CITATION LIST

Patent Literature

Patent Literature 1: Japanese Patent No. 4858662
Patent Literature 2: Japanese Patent Application Laid-open No. 2012-93153
Patent Literature 3: WO 2010/103776

DISCLOSURE OF INVENTION

Technical Problem

In recent years, along with miniaturization and thinning of electronic apparatuses, further miniaturization and multi-functionality of various components and sensors to be mounted on the electronic apparatuses are being demanded. The gyro sensor is required to be not only compact but also capable of highly-accurately detecting angular velocities in multiaxial directions using a single sensor.

In view of the circumstances as described above, the present technology aims at providing a sensor device, a gyro sensor, and an electronic apparatus capable of highly-accurately detecting angular velocities in multiaxial directions.

Solution to Problem

A sensor device according to an embodiment of the present technology includes a vibrator unit, an annular base portion, a plurality of coupling portions, and a wiring layer.

The vibrator unit includes an annular frame, a plurality of pendulum portions, a plurality of piezoelectric drive units, a plurality of first piezoelectric detection units, and a plurality of second piezoelectric detection units. The annular frame includes a first main surface. The plurality of pendulum portions each include one end portion supported by the frame. The plurality of piezoelectric drive units each include a piezoelectric film and first and second drive electrodes opposing each other while sandwiching the piezoelectric film and cause the frame to vibrate within a plane parallel to the first main surface. The plurality of first piezoelectric detection units each include a first detection electrode and detect an angular velocity about a first axis vertical to the first main surface on the basis of a deformation amount of the first main surface of the frame. The plurality of second piezoelectric detection units each include a second detection electrode and detect angular velocities in biaxial directions orthogonal to the first axis on the basis of a deformation amount of the plurality of pendulum portions in a direction vertical to the first main surface.

The annular base portion includes a plurality of terminal portions and is arranged around the vibrator unit.

The plurality of coupling portions are arranged between the vibrator unit and the base portion and support the vibrator unit with respect to the base portion in a state where the vibrator unit is capable of vibrating.

The wiring layer includes a plurality of drive wirings and a plurality of detection wirings. The plurality of drive wirings are respectively connected to the first and second drive electrodes while being adjacent and parallel to one another. The plurality of detection wirings are respectively connected to the first and second detection electrodes while being adjacent and parallel to one another. The wiring layer is provided at each of the plurality of coupling portions to electrically connect the plurality of terminal portions with the plurality of piezoelectric drive units, first piezoelectric detection units, and second piezoelectric detection units, respectively.

In the sensor device, the vibrator unit is supported by the base portion via the plurality of coupling portions, and the plurality of piezoelectric drive units cause the frame and plurality of pendulum portions to vibrate in synchronization with one another within a plane parallel to the first main surface.

In this state, when an angular velocity about the first axis acts on the frame, a Coriolis force is generated with respect to the frame in a direction orthogonal to the vibration direction at that moment, with the result that the frame is deformed within the plane parallel to the first main surface. The plurality of first piezoelectric detection units output detection signals corresponding to the angular velocity about the first axis on the basis of the deformation amount of the frame.

On the other hand, when an angular velocity about an axis orthogonal to the first axis acts, a Coriolis force is generated with respect to the plurality of pendulum portions in a direction orthogonal to the vibration direction at that moment, with the result that the pendulum portions are deformed in a direction vertical to the first main surface. The plurality of second piezoelectric detection units output detection signals corresponding to the angular velocity about the axis on the basis of the deformation amount of the pendulum portions.

In this way, the sensor device is configured to be capable of detecting angular velocities about 3 axes orthogonal to one another.

The wiring layer that electrically connects the piezoelectric drive units and piezoelectric detection units of the vibrator and the terminal portions of the base portion is provided at each of the plurality of coupling portions. Since the plurality of drive wirings configuring the wiring layer are arranged adjacent to one another in the sensor device, crosstalk with the plurality of detection wirings arranged on the same coupling portions can be reduced. Accordingly, it becomes possible to highly-accurately detect angular velocities about the respective axes.

The plurality of coupling portions typically include a first end portion connected to the vibrator unit, a second end portion connected to the base portion, and a second main surface that supports the wiring layer and is parallel to the first main surface. Further, the plurality of drive wirings are unevenly arranged on one side of the second main surface from the first end portion toward the second end portion, and the plurality of detection wirings are unevenly arranged on another side of the second main surface from the first end portion toward the second end portion.

With this configuration, it becomes possible to form the plurality of drive wirings and detection wirings on the same plane of the coupling portions and reduce crosstalk of signals among the drive wirings and detection wirings arranged on the same plane. Accordingly, it becomes possible to miniaturize the device and suppress lowering of angular velocity detection accuracy.

The plurality of drive wirings and detection wirings may be arranged in a line symmetry with one another using a center line of each of the plurality of coupling portions as a symmetrical axis and at regular intervals on the second main surface.

Accordingly, since a mechanical symmetric property of the vibrator unit is maintained, the vibrator unit can be caused to stably vibrate in a predetermined vibration mode without causing a contortion.

The plurality of detection wirings typically include a first detection wiring connected to the first detection electrode, and a second detection wiring connected to the second detection electrode. In this case, the detection wiring connected to one of the first and second detection electrodes having a larger electrode capacity may be arranged adjacent to the plurality of drive wirings.

By arranging one of the first and second detection wirings having a lower impedance and is hardly influenced by noises adjacent to the drive wirings, an influence of crosstalk can be made small.

The plurality of drive wirings typically include a first drive wiring and a second drive wiring. The first drive wiring is connected to the first drive electrode, and a first drive signal is input thereto. The second drive wiring is connected to the second drive electrode, and a second drive signal having an opposite phase from the first drive signal is input thereto. In this case, the second drive wiring may be arranged between the plurality of detection wirings and the first drive wiring at the plurality of coupling portions.

By setting the drive wirings in the vicinity of the detection wirings to have the same polarity at the coupling portions, it becomes possible to cancel noise components superimposed on angular velocity signals in calculation processing.

The plurality of drive wirings and detection wirings may each be formed of a material having a lower elastic modulus than the first and second drive electrodes and the first and second detection electrodes.

The wiring layer may further include an organic film that covers the plurality of drive wirings and detection wirings.

The configuration of the vibrator is not limited in particular, and the piezoelectric drive units, the piezoelectric detection units, the coupling portions, and the like are set as appropriate according to the shape of the frame.

For example, the frame includes a set of first beams, a set of second beams, and 4 connection portions that connect the first beams and the second beams. The set of first beams extend in a second axis direction orthogonal to the first axis and oppose each other in a third axis direction orthogonal to each of the first and second axes. The set of second beams extend in the third axis direction and oppose each other in the second axis direction.

The plurality of pendulum portions include 4 pendulum portions that protrude toward a center of the frame from the 4 connection portions.

The plurality of coupling portions include 4 coupling portions that extend toward the base portion from the 4 connection portions.

In the configuration described above, the plurality of piezoelectric drive units may include a pair of first piezoelectric drive units and a pair of second piezoelectric drive units. The pair of first piezoelectric drive units is respectively provided on the first main surface of the first beams and includes the first drive electrode as an upper electrode. The pair of second piezoelectric drive units is respectively provided on the first main surface of the second beams and includes the second drive electrode as an upper electrode.

On the other hand, the plurality of first piezoelectric detection units include 4 piezoelectric detection units that are respectively provided on the first main surface of the 4 connection portions, and the plurality of second piezoelectric detection units include 4 piezoelectric detection units that are respectively provided on the 4 pendulum portions.

A gyro sensor according to an embodiment of the present technology includes a vibrator unit, an annular base portion, a plurality of coupling portions, a wiring layer, and a circuit device.

The vibrator unit includes an annular frame, a plurality of pendulum portions, a plurality of piezoelectric drive units, a plurality of first piezoelectric detection units, and a plurality of second piezoelectric detection units. The annular frame includes a first main surface. The plurality of pendulum portions each include one end portion supported by the frame. The plurality of piezoelectric drive units each include a piezoelectric film and first and second drive electrodes opposing each other while sandwiching the piezoelectric film and cause the frame to vibrate within a plane parallel to the first main surface. The plurality of first piezoelectric detection units each include a first detection electrode and detect an angular velocity about a first axis vertical to the first main surface on the basis of a deformation amount of the first main surface of the frame. The plurality of second piezoelectric detection units each include a second detection electrode and detect angular velocities in biaxial directions orthogonal to the first axis on the basis of a deformation amount of the plurality of pendulum portions in a direction vertical to the first main surface.

The annular base portion includes a plurality of terminal portions and is arranged around the vibrator unit.

The plurality of coupling portions are arranged between the vibrator unit and the base portion and support the vibrator unit with respect to the base portion in a state where the vibrator unit is capable of vibrating.

The wiring layer includes a plurality of drive wirings and a plurality of detection wirings. The plurality of drive wirings are respectively connected to the first and second drive electrodes while being adjacent and parallel to one another. The plurality of detection wirings are respectively connected to the first and second detection electrodes while being adjacent and parallel to one another. The wiring layer is provided at each of the plurality of coupling portions to electrically connect the plurality of terminal portions with the plurality of piezoelectric drive units, first piezoelectric detection units, and second piezoelectric detection units, respectively.

The circuit device supports the base portion and is electrically connected to the plurality of terminal portions.

According to an embodiment of the present technology, there is provided an electronic apparatus on which a gyro sensor is mounted, the gyro sensor including a vibrator unit, an annular base portion, a plurality of coupling portions, a wiring layer, and a circuit device.

The vibrator unit includes an annular frame, a plurality of pendulum portions, a plurality of piezoelectric drive units, a plurality of first piezoelectric detection units, and a plurality of second piezoelectric detection units. The annular frame includes a first main surface. The plurality of pendulum portions each include one end portion supported by the frame. The plurality of piezoelectric drive units each include a piezoelectric film and first and second drive electrodes opposing each other while sandwiching the piezoelectric film and cause the frame to vibrate within a plane parallel to the first main surface. The plurality of first piezoelectric detection units each include a first detection electrode and detect an angular velocity about a first axis vertical to the first main surface on the basis of a deformation amount of the first main surface of the frame. The plurality of second piezoelectric detection units each include a second detection electrode and detect angular velocities in biaxial directions orthogonal to the first axis on the basis of a deformation amount of the plurality of pendulum portions in a direction vertical to the first main surface.

The annular base portion includes a plurality of terminal portions and is arranged around the vibrator unit.

The plurality of coupling portions are arranged between the vibrator unit and the base portion and support the vibrator unit with respect to the base portion in a state where the vibrator unit is capable of vibrating.

The wiring layer includes a plurality of drive wirings and a plurality of detection wirings. The plurality of drive wirings are respectively connected to the first and second drive electrodes while being adjacent and parallel to one another. The plurality of detection wirings are respectively connected to the first and second detection electrodes while being adjacent and parallel to one another. The wiring layer is provided at each of the plurality of coupling portions to electrically connect the plurality of terminal portions with the plurality of piezoelectric drive units, first piezoelectric detection units, and second piezoelectric detection units, respectively.

The circuit device supports the base portion and is electrically connected to the plurality of terminal portions.

Advantageous Effects of Invention

As described above, according to the present technology, angular velocities in multiaxial directions can be detected with high accuracy.

It should be noted that the effects described herein are not necessarily limited, and any effect described in the present disclosure may be obtained.

MODE FOR CARRYING OUT THE INVENTION

Hereinafter, an embodiment of the present technology will be described with reference to the drawings.

Figure 1:
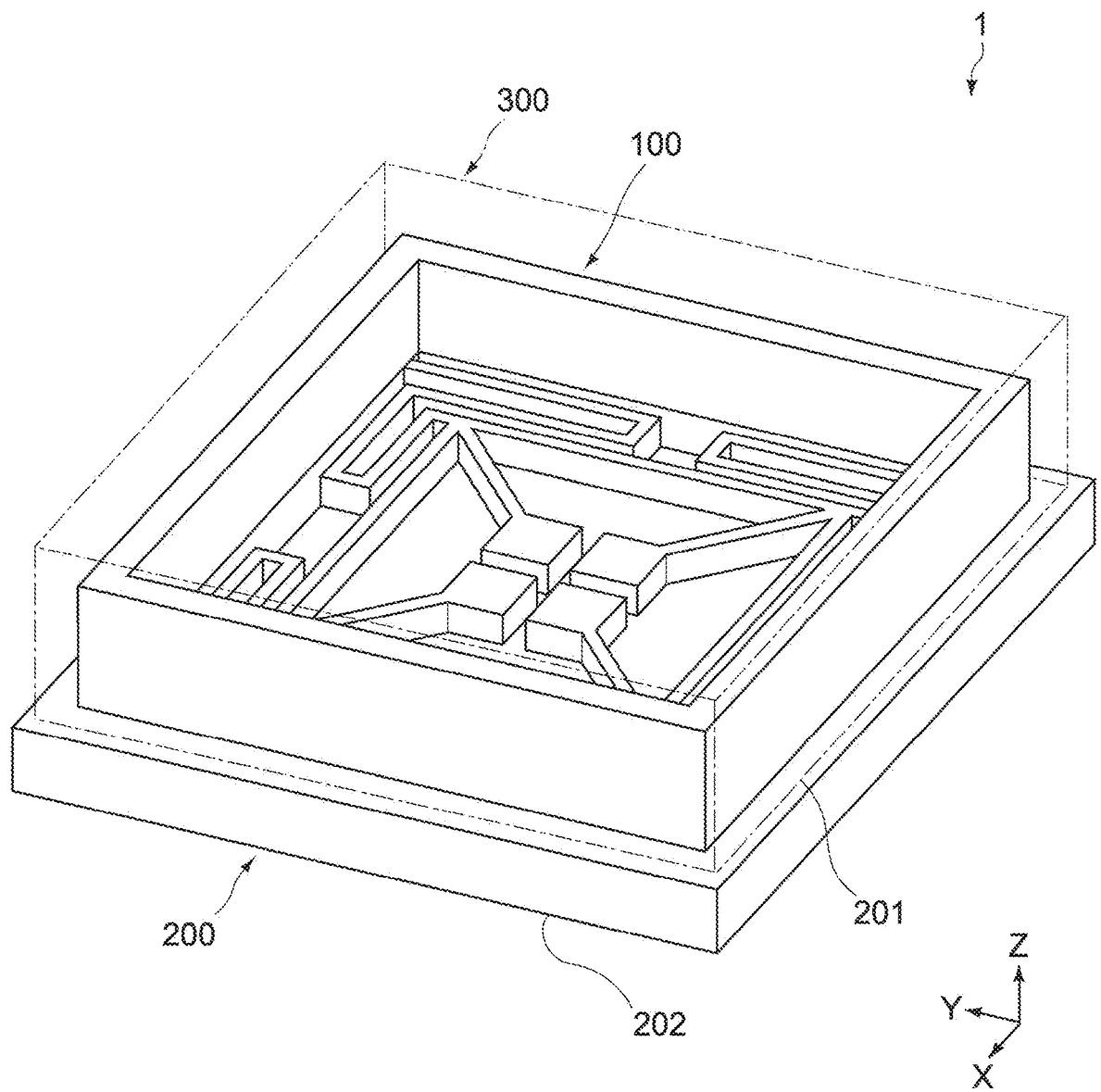
FIG. 1 A schematic perspective view showing a configuration of a gyro sensor according to an embodiment of the present technology.

FIG. 1 is a perspective view showing a gyro sensor 1 according to an embodiment of the present technology. In the figure, X, Y, and Z axes indicate triaxial directions orthogonal to one another. The X-axis direction corresponds to a longitudinal direction of the gyro sensor 1, the Y-axis direction corresponds to a lateral direction thereof, and the Z-axis direction corresponds to a thickness direction thereof (same holds true for subsequent figures).

[Gyro Sensor]

The gyro sensor 1 of this embodiment includes a sensor device 100 and a controller 200. The gyro sensor 1 is configured as a single packaged component having a substantially cuboid shape as a whole and has a COC (Chip On Chip) structure in which the sensor device 100 is mounted on the controller 200. The gyro sensor 1 has a size of about 2 mm in height and width and about 0.7 mm in thickness, for example.

The sensor device 100 is configured as a gyro sensor device capable of outputting signals related to angular velocities. As will be described later, the sensor device 100 has a MEMS (Micro Electro Mechanical System) structure formed by microfabricating an SOI (Silicon On Insulator) substrate in a predetermined shape.

The controller 200 is typically constituted of a circuit device such as an IC (Integrated Circuit) chip. The controller 200 includes a function of calculating angular velocity signals from an output of the sensor device 100 as well as driving the sensor device 100. A plurality of internal connection terminals that are electrically connected to the sensor device 100 are provided on an upper surface 201 of the controller 200, and an external connection terminal that is electrically connected to a control substrate (wiring substrate) (not shown) is provided on a lower surface 202 of the controller 200.

The gyro sensor 1 further includes a cover portion 300 that covers the sensor device 100. The cover portion 300 is attached to the upper surface 201 of the controller 200 and is configured to be capable of shielding the sensor device 100 from outside. The cover portion 300 may be formed of a conductive material such as metal or may be formed of a material having an electrical insulation property, such as a synthetic resin. The cover portion 300 functions as a cover that prevents foreign substances from entering the gyro sensor 1. Further, in a case where the cover portion 300 is formed of a conductive material, the cover portion 300 functions as an electromagnetic shield of the sensor device 100 by being electrically connected to a ground terminal of the controller 200, for example.

The gyro sensor 1 is mounted on a control substrate of an electronic apparatus (not shown) via the external connection terminal provided on the lower surface 202 of the controller 200. Examples of the electronic apparatus include a video camera, a car navigation system, a game machine, and a wearable apparatus such as a head-mount display.

[Basic Configuration of Sensor Device]

Figure 2:
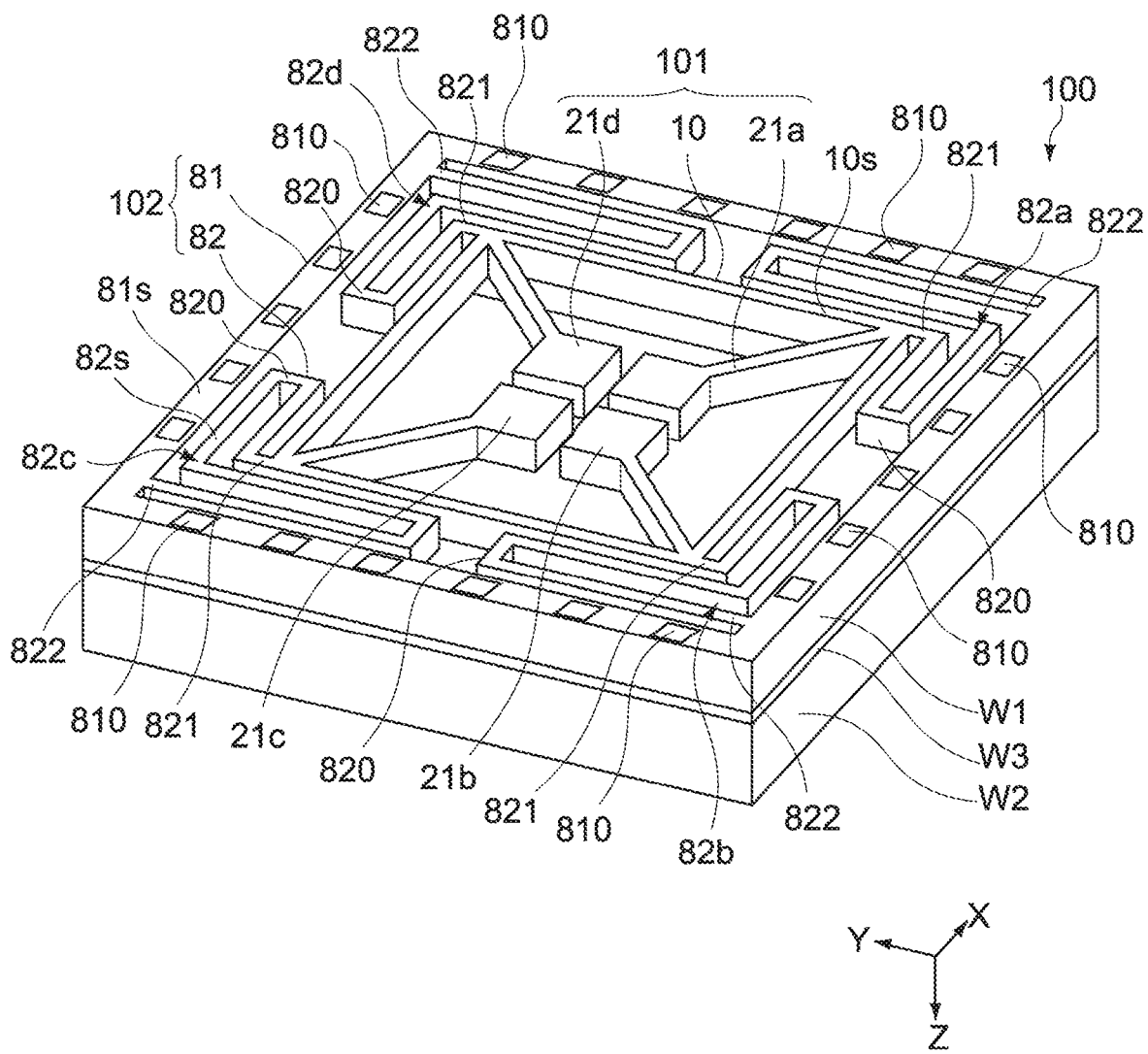
FIG. 2 A schematic perspective view showing a configuration example of a sensor device in the gyro sensor.

Next, details of the sensor device 100 will be described. FIG. 2 is a schematic perspective view showing a configuration example of the sensor device 100 and shows a back surface side of the device opposing the controller 200.

The sensor device 100 includes a vibrator unit 101 and a frame body 102. The vibrator unit 101 includes, as a plurality of vibration units, a frame 10 including a set of first beams, a set of second beams, and connection portions and a plurality of pendulum portions 21a to 21d. The frame body 102 includes a base portion 81 and coupling portions 82.

The sensor device 100 is formed of a material including monocrystal silicon (Si). For example, the sensor device 100 is formed by microfabricating an SOI substrate obtained by attaching two silicon substrates and includes an active layer W1, a support layer W2, and a bonding layer (BOX (Buried-Oxide) layer) W3. The active layer W1 and the support layer W2 are each constituted of a silicon substrate, and the bonding layer W3 is constituted of a silicon oxide film. The vibrator unit 101 and the frame body 102 are formed by microfabricating the active layer W1 in a predetermined shape, and the support layer W2 and the bonding layer W3 are formed like a frame around the active layer W1. Thicknesses of the active layer W1, the support layer W2, and the bonding layer W3 are respectively about 40 μm, about 300 μm, and about 1 μm, for example.

(1. Vibrator Unit)

Figure 3:
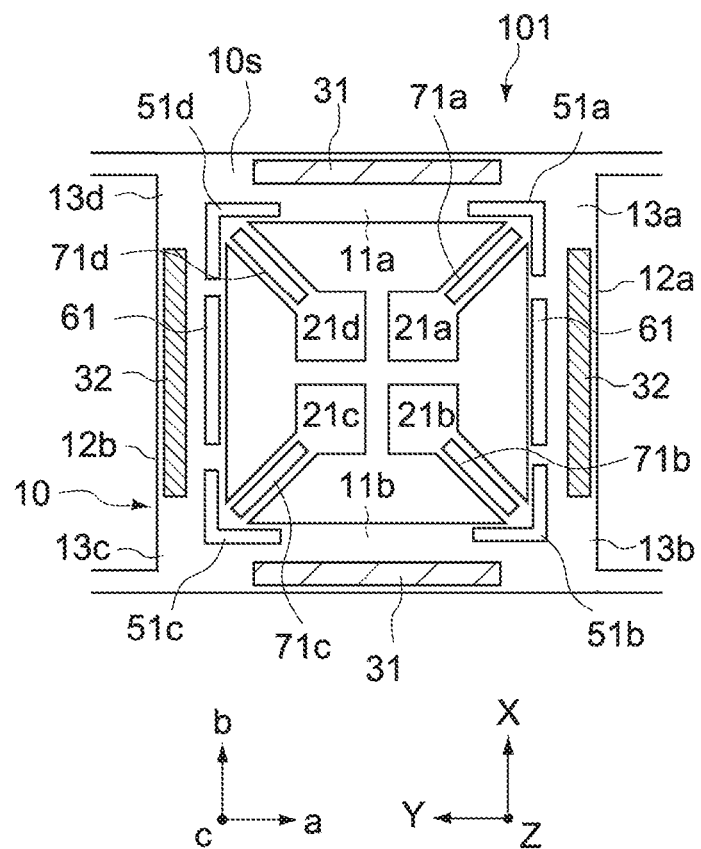
FIG. 3 A schematic plan view showing a configuration of a vibrator unit in the sensor device.

FIG. 3 is a plan view schematically showing a configuration of the vibrator unit 101.

(1-1. Frame)

The vibrator unit 101 includes the annular frame 10 including 4 sides. The lateral direction of the frame 10 is an a-axis direction, the longitudinal direction thereof is a b-axis direction, and the thickness direction thereof is a c-axis direction. On the other hand, in FIG. 3, the Y axis is set in an axial direction parallel to the a axis, and the X axis is set in an axial direction parallel to the b axis. The Z-axis direction is an axial direction parallel to the c-axis direction.

The frame 10 includes a main surface 10s (first main surface) opposing the controller 200. Each side of the frame 10 functions as a vibration beam, and the frame 10 includes a set of first beams 11a and 11b and a set of second beams 12a and 12b.

The set of first beams 11a and 11b are configured as a set of opposite sides that extend parallel to each other in the a-axis direction in FIG. 3 and oppose each other in the b-axis direction orthogonal to the a-axis direction. The set of second beams 12a and 12b are configured as another set of opposite sides that mutually extend in the b-axis direction and oppose each other in the a-axis direction. The beams 11a, 11b, 12a, and 12b have the same length, width, and thickness, and an outer appearance of the frame 10 is a hollow quadrate. A cross section of each beam vertical to the longitudinal direction is substantially rectangular.

The size of the frame 10 is not limited in particular. For example, the length of one side of the frame 10 is 1000 to 4000 μm, the thickness of the frame 10 is 10 to 200 μm, and the width of the beams 11a, 11b, 12a, and 12b is 50 to 200 μm.

At portions corresponding to 4 corners of the frame 10, a plurality of (4 in this example) connection portions 13a, 13b, 13c, and 13d that connect the set of first beams 11a and 11b and the set of second beams 12a and 12b are provided. Both ends of the set of first beams 11a and 11b and the set of second beams 12a and 12b are supported by the connection portions 13a to 13d. In other words, the beams 11a, 11b, 12a, and 12b function as vibration beams having both ends supported by the connection portions 13a to 13d.

(1-2. Pendulum Portions)

The vibrator unit 101 includes the plurality of pendulum portions 21a, 21b, 21c, and 21d.

The pendulum portions 21a and 21c are respectively formed at the set of connection portions 13a and 13c in a diagonal relationship and extend toward an inner side of the frame 10 along the diagonal line direction. One ends of the pendulum portions 21a and 21c are respectively supported by the connection portions 13a and 13c and protrude toward the center of the frame 10, and other ends thereof oppose each other near the center of the frame 10.

The pendulum portions 21b and 21d are respectively formed at the other set of connection portions 13b and 13d in a diagonal relationship and extend toward the inner side of the frame 10 along the diagonal line direction. One ends of the pendulum portions 21b and 21d are respectively supported by the connection portions 13b and 13d and protrude toward the center of the frame 10, and other ends thereof oppose each other near the center of the frame 10.

The pendulum portions 21a to 21d typically have the same shape and size and are formed at the same time when processing an outer shape of the frame 10. The shape and size of the pendulum portions 21a to 21d are not limited in particular, and the pendulum portions do not all need to be formed in the same shape and the like.

(1-3. Piezoelectric Drive Units)

The vibrator unit 101 includes a plurality of piezoelectric drive units that cause the frame 10 to vibrate within an XY plane parallel to the main surface 10s.

The plurality of piezoelectric drive units include a pair of first piezoelectric drive units 31 respectively provided on the main surface 10s of the first beams 11a and 11b and a pair of second piezoelectric drive units 32 respectively provided on the main surface 10s of the second beams 12a and 12b. The first and second piezoelectric drive units 31 and 32 are mechanically deformed according to an input voltage and cause the beams 11a, 11b, 12a, and 12b to vibrate by a drive force caused by the deformation. The deformation direction is controlled by a polarity of the input voltage.

The first and second piezoelectric drive units 31 and 32 are formed linearly on the upper surfaces (main surface 10s) of the beams 11a, 11b, 12a, and 12b while being in parallel with axes of the beams. In FIG. 3, to help understand the figure, the first and second piezoelectric drive units 31 and 32 are indicated by different hatchings. The first piezoelectric drive units 31 are arranged on an outer edge side of the set of first beams 11a and 11b, and the second piezoelectric drive units 32 are arranged on an outer edge side of the set of second beams 12a and 12b.

Figure 4:
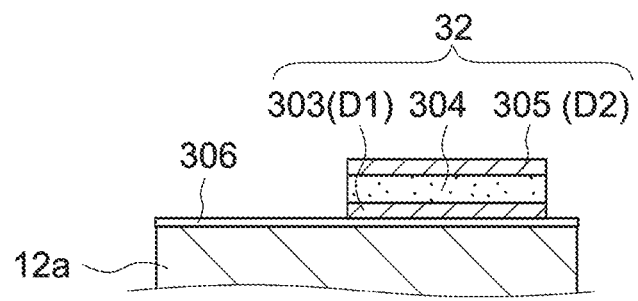
FIG. 4 A schematic cross-sectional diagram showing a main portion of the vibrator unit.

The first and second piezoelectric drive units 31 and 32 have the same configuration. As an example, a cross-sectional structure of the second piezoelectric drive unit 32 arranged on the second beam 12a is shown in FIG. 4. Each piezoelectric drive unit includes a laminated structure constituted of a lower electrode layer 303, a piezoelectric film 304, and an upper electrode layer 305. The upper electrode layer 305 corresponds to a first drive electrode (D1) in the first piezoelectric drive units 31 and corresponds to a second drive electrode (D2) in the second piezoelectric drive units 32. On the other hand, the lower electrode layer 303 corresponds to the second drive electrode (D2) in the first piezoelectric drive units 31 and corresponds to the first drive electrode (D1) in the second piezoelectric drive units 32. An insulation film 306 such as a silicon oxide film is formed on the front surface (main surface 10s) of the beams where the piezoelectric drive layers are formed.

The piezoelectric film 304 is typically formed of lead zirconate titanate (PZT). The piezoelectric film 304 is polarization-oriented so as to extend and contract according to a potential difference between the lower electrode layer 303 and the upper electrode layer 305. At this time, AC voltages of opposite phases are respectively applied onto the upper electrode layer 305 and the lower electrode layer 303. Accordingly, the piezoelectric film 304 can be extended and contracted with about twice the amplitude as compared to the case where the lower electrode layer 303 is used as a common electrode.

In this embodiment, a first drive signal (G+) is input to the upper electrode layer (first drive electrode D1) of each of the first piezoelectric drive units 31, and a second drive signal (G−) differential (opposite phase) from the drive signal (G+) is input to the lower electrode layer (second drive electrode D2) of each of the first piezoelectric drive units 31. On the other hand, a second drive signal (G−) is input to the upper electrode layer (second drive electrode D2) of each of the second piezoelectric drive units 32, and a first drive signal (G+) is input to the lower electrode layer (first drive electrode D1) of each of the second piezoelectric drive units 32.

(1-4. Drive Principle of Vibrator Unit)

Voltages of opposite phases are respectively applied onto the first and second piezoelectric drive units 31 and 32 so that one of them contracts when the other extends. Accordingly, the set of second beams 12a and 12b undergo a flexural deformation in the a-axis direction while both ends thereof are supported by the connection portions 13a to 13d and alternately vibrate in a direction in which they part from each other and a direction in which they approach each other within the XY plane. Similarly, the set of first beams 11a and 11b undergo a flexural deformation in the b-axis direction while both ends thereof are supported by the connection portions 13a to 13d and alternately vibrate in the direction in which they part from each other and the direction in which they approach each other within the XY plane.

Therefore, when the set of first beams 11a and 11b vibrate in the direction in which they approach each other, the set of second beams 12a and 12b vibrate in the direction in which they part from each other, and when the set of first beams 11a and 11b vibrate in the direction in which they part from each other, the set of second beams 12a and 12b vibrate in the direction in which they approach each other. At this time, the center portions of the beams 11a, 11b, 12a, and 12b each form a vibration antinode, and both ends thereof (connection portions 13a to 13d) each form a vibration node. Such a vibration mode will hereinafter be referred to as basic vibration of frame 10.

The beams 11a, 11b, 12a, and 12b are driven at resonance frequencies of the beams. The resonance frequencies of the beams 11a, 11b, 12a, and 12b are determined depending on their shapes, lengths, and the like. The resonance frequencies of the beams 11a, 11b, 12a, and 12b are typically set within the range of 1 to 100 kHz.

Figure 5:
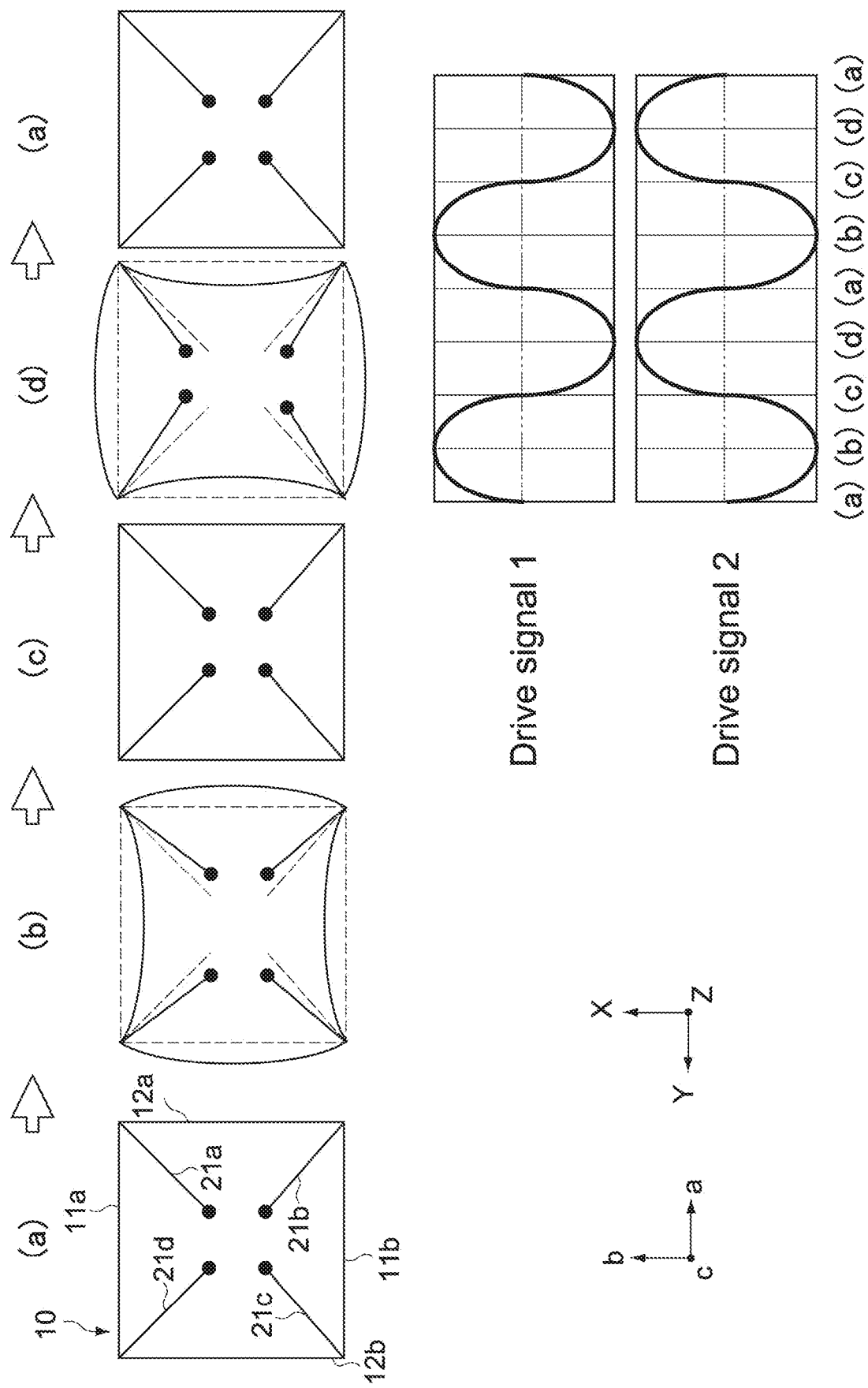
FIG. 5 Diagrams for explaining vibration modes of the vibrator unit.

FIG. 5 are schematic diagrams showing a time change of the basic vibration of the frame 10. In FIG. 5, the "drive signal 1" indicates a time change of an input voltage applied to the upper electrode layer 305 (first drive electrode D1) of the first piezoelectric drive units 31, and the "drive signal 2" indicates a time change of an input voltage applied to the upper electrode layer 306 (second drive electrode D2) of the second piezoelectric drive units 32.

As shown in FIG. 5, the drive signal 1 and the drive signal 2 have AC waveforms that change in mutually-reverse phases. Accordingly, the frame 10 changes in the order of (a), (b), (c), (d), (a), . . . and vibrates in a vibration mode in which one of the set of first beams 11a and 11b and the set of second beams 12a and 12b are set apart from each other when the other set of beams are brought close to each other and one of the set of beams are brought close to each other when the other set of beams are set apart from each other.

Along with the basic vibration of the frame 10 described above, the pendulum portions 21a to 21d also vibrate in synchronization with the vibration of the frame 10 within the XY plane about the connection portions 13a to 13d. The vibrations of the plurality of pendulum portions 21a to 21d are excited by the vibrations of the beams 11a, 11b, 12a, and 12b. In this case, the pendulum portions 21a and 21c and the pendulum portions 21b and 21d vibrate (swing) in mutually-opposite phases in a lateral swing direction from support points of the pendulum portions, that is, the connection portions 13a to 13d, within the XY plane.

As shown in FIG. 5, when the set of first beams 11a and 11b vibrate in the direction in which they approach each other, the pendulum portions 21a and 21d vibrate in a direction in which they are set apart from each other (state (b)), and when the set of first beams 11a and 11b vibrate in the direction in which they are set apart from each other, the pendulum portions 21a and 21d vibrate in a direction in which they approach each other (state (d)). Also the pendulum portions 21b and 21c alternately vibrate in the parting direction and approaching direction according to the vibration direction of the set of second beams 12a and 12b. In this way, the pendulum portions 21a and 21c and the pendulum portions 21b and 21d vibrate in mutually-opposite phases in synchronization with the basic vibration of the frame 10.

Figure 6:
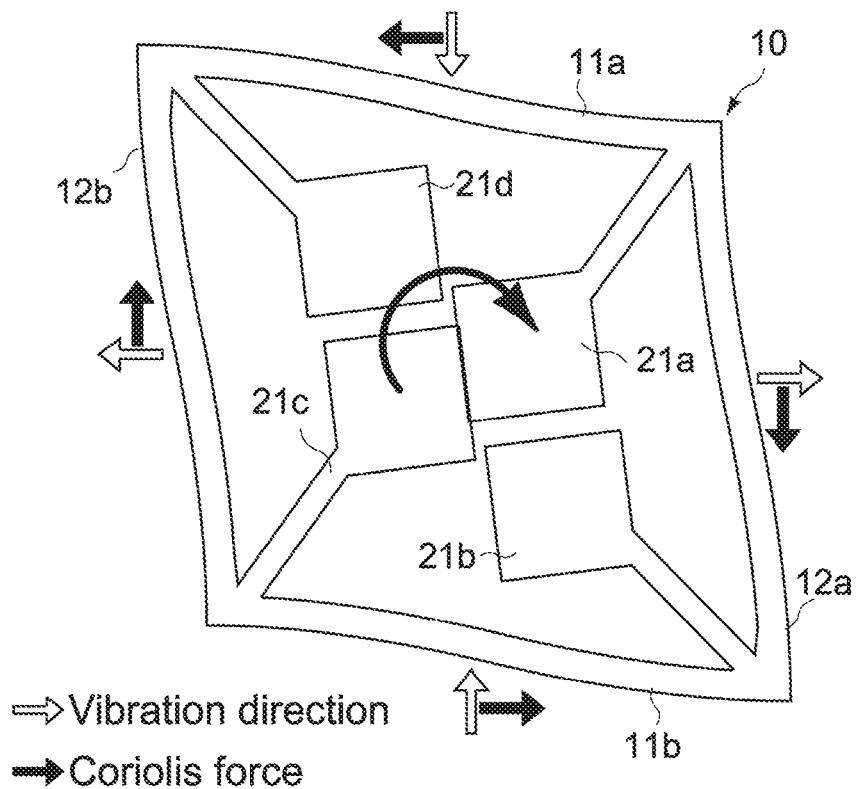
FIG. 6 A schematic plan view for explaining an operational example of the vibrator unit.

As described above, by applying AC voltages of mutually-opposite phases onto the first and second drive electrodes D1 and D2, the beams 11a, 11b, 12a, and 12b of the frame 10 vibrate in the vibration mode shown in FIG. 5. When an angular velocity about the Z axis acts on the frame 10 continuing such a basic vibration, a Coriolis force due to the angular velocity acts on the respective points of the frame 10. As a result, the frame 10 is deformed so as to be distorted within the XY plane as shown in FIG. 6. Therefore, by detecting the deformation amount of the frame 10 within the XY plane, the magnitude and direction of the angular velocity that has acted on the frame 10 can be detected.

FIG. 6 is a plan view schematically showing a deformation state of the frame 10 at an instant the angular velocity about the Z axis acts on the frame 10. It should be noted that to help understand the descriptions, the shape and deformation state of the frame 10 are slightly exaggerated.

When an angular velocity in a clockwise direction about the Z axis acts on the frame 10 vibrating in the basic vibration, a Coriolis force proportional to the magnitude of the angular velocity is generated in the movement directions (vibration directions) and a direction 90 degrees in the clockwise direction at that instant at the respective points of the frame 10 (beams 11a, 11b, 12a, and 12b and pendulum portions 21a to 21d) within the XY plane orthogonal to the Z axis. Specifically, the directions of the Coriolis force is determined depending on the vibration directions at the instant at the points where the Coriolis force acts as shown in FIG. 6. Accordingly, the frame 10 is squashed (distorted) within the XY plane so as to become a substantial parallelogram from a quadrate.

It should be noted that FIG. 6 shows a state where a predetermined angular velocity acts in a clockwise direction about the Z axis. When the angular velocity direction is opposite (counterclockwise), the directions of the Coriolis force that acts on the respective points also become opposite.

(1-5. First Piezoelectric Detection Units)

As shown in FIG. 3, the vibrator unit 101 further includes a plurality of first piezoelectric detection units 51a, 51b, 51c, and 51d. The first piezoelectric detection units 51a to 51d each detect an angular velocity about the Z axis (first axis) vertical to the main surface 10s on the basis of the deformation amount of the main surface 10s of the frame 10. The first piezoelectric detection units 51a to 51d include 4 piezoelectric detection units respectively provided on the main surface 10s of the 4 connection portions 13a to 13d.

The first piezoelectric detection units 51a and 51c are respectively formed in a periphery of the set of connection portions 13a and 13c as one of the sets in a diagonal relationship. Of those, the piezoelectric detection unit 51a extends bidirectionally along the beams 11a and 12a from the connection portion 13a, and the other piezoelectric detection unit 51c extends bidirectionally along the beams 11b and 12b from the connection portion 13c.

Similarly, the first piezoelectric detection units 51b and 51d are respectively formed in a periphery of the other set of connection portions 13b and 13d in a diagonal relationship. Of those, the piezoelectric detection unit 51b extends bidirectionally along the beams 11b and 12a from the connection portion 13b, and the other piezoelectric detection unit 51d extends bidirectionally along the beams 11a and 12b from the connection portion 13d.

The first piezoelectric detection units 51a to 51d have a configuration similar to that of the first and second piezoelectric drive units 31 and 32. In other words, the first piezoelectric detection units 51a to 51d are each configured by a laminated body constituted of a lower electrode layer, a piezoelectric film, and an upper electrode layer and respectively have functions of converting mechanical deformations of the beams 11a, 11b, 12a, and 12b into electric signals. In each of the first piezoelectric detection units 51a to 51d, the lower electrode layer is connected to a reference potential (Vref) such as a ground potential, and the upper electrode layer constitutes a first detection electrode (S1) that outputs a corresponding one of detection signals z1, z2, z3, and z4.

In the vibrator unit 101 shown in FIG. 3, when an angular velocity about the Z axis acts, inner angles of the frame 10 periodically fluctuate as shown in FIGS. 5 and 6. At this time, the fluctuations of inner angles become mutually-opposite phases between the set of connection portions 13a and 13c in the diagonal relationship and the other set of connection portions 13b and 13d. Therefore, the output of the piezoelectric detection unit 51a on the connection portion 13a and the output of the piezoelectric detection unit 51c on the connection portion 13c become the same in principle, and the output of the piezoelectric detection unit 51b on the connection portion 13b and the output of the piezoelectric detection unit 51d on the connection portion 13d become the same in principle. In this regard, by calculating a difference between a sum of outputs of the two piezoelectric detection units 51a and 51c and a sum of outputs of the two piezoelectric detection units 51b and 51d, it becomes possible to detect a magnitude and direction of the angular velocity about the Z axis that acts on the frame 10.

(1-6. Second Piezoelectric Detection Units)

On the other hand, as detection units that detect an angular velocity about the X axis and an angular velocity about the Y axis, the vibrator unit 101 includes a plurality of second piezoelectric detection units 71a, 71b, 71c, and 71d. The second piezoelectric detection units 71a to 71d detect angular velocities in biaxial directions orthogonal to the Z axis (e.g., X-axis direction and Y-axis direction) on the basis of the deformation amounts of the plurality of pendulum portions 21a to 21d in the Z-axis direction. The second piezoelectric detection units 71a to 71d include 4 piezoelectric detection units respectively provided on the 4 pendulum portions 21a to 21d.

The second piezoelectric detection units 71a to 71d are linearly formed on the front surfaces of and on axial centers of the pendulum portions 21a to 21d. The second piezoelectric detection units 71a to 71d have configurations similar to those of the first piezoelectric detection units 51a to 51d, are each configured by a laminated body constituted of a lower electrode layer, a piezoelectric film, and an upper electrode layer, and respectively have functions of converting mechanical deformations of the pendulum portions 21a to 21d into electric signals. In each of the second piezoelectric detection units 71a to 71d, the lower electrode layer is connected to a reference potential (Vref) such as a ground potential, and the upper electrode layer constitutes a second detection electrode (S2) that outputs a corresponding one of detection signals xy1, xy2, xy3, and xy4.

In this embodiment, one of angular velocity detection axes (Y axis) is set in an axial direction parallel to the a axis, and the other one of the angular velocity detection axes (X axis) is set in an axial direction parallel to the b axis. In such a configuration, the second piezoelectric detection units 71a to 71d respectively provided on the pendulum portions 21a to 21d function as detection units for detecting angular velocities about the X axis and angular velocities about the Y axis.

Figure 7:
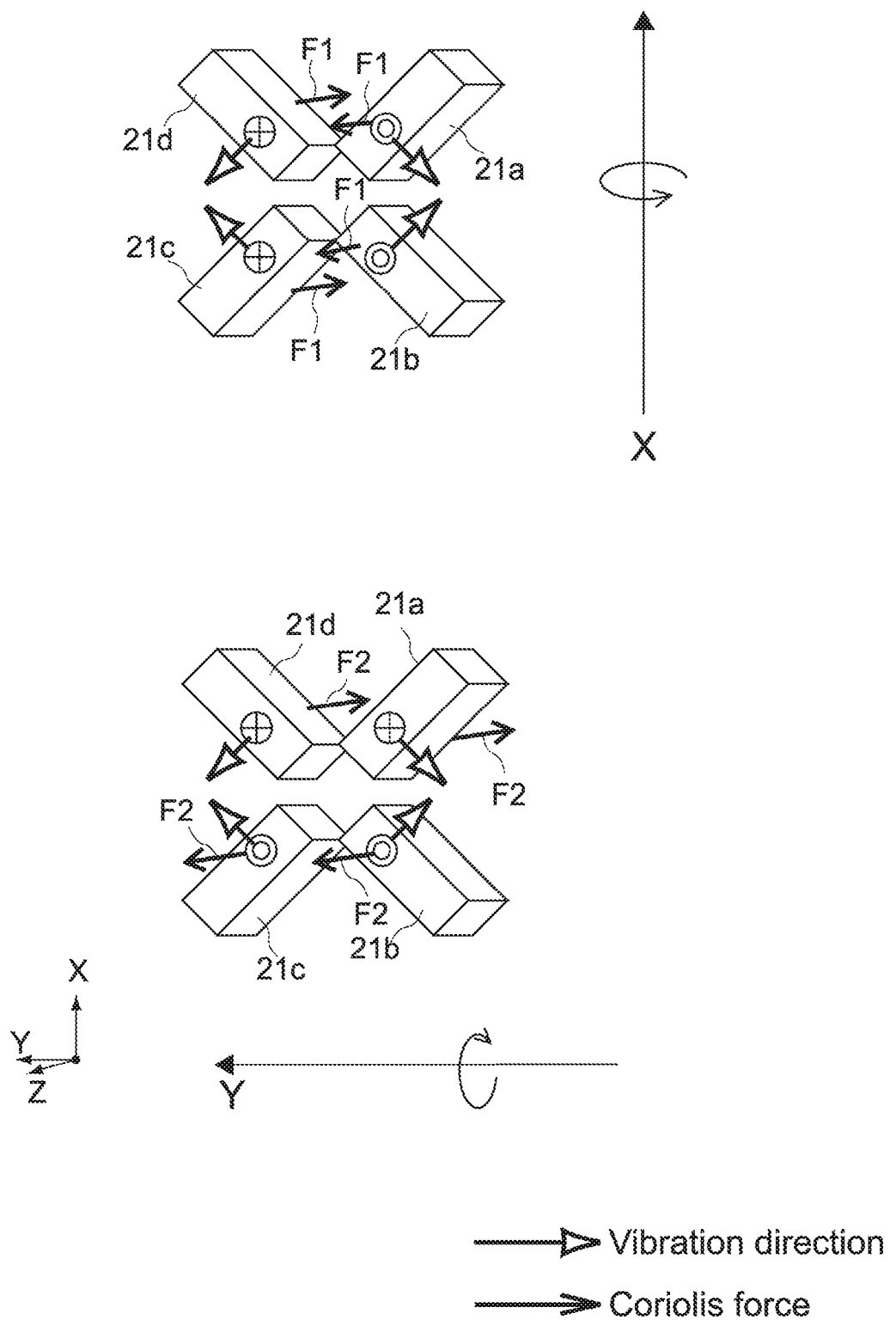
FIG. 7 A schematic perspective view for explaining another operational example of the vibrator unit.

AC voltages of mutually-opposite phases are respectively applied onto the first and second drive electrodes D1 and D2. Accordingly, the beams 11a, 11b, 12a, and 12b and the pendulum portions 21a to 21d of the frame 10 vibrate in the vibration mode shown in FIG. 5 (basic vibration). The upper part of FIG. 7 is a schematic perspective view for explaining a vibration form of the pendulum portions 21a to 21d at a time an angular velocity about the X axis acts on the frame 10. On the other hand, the lower part of FIG. 7 is a schematic perspective view for explaining a vibration form of the pendulum portions 21a to 21d at a time an angular velocity about the Y axis acts on the frame 10.

When an angular velocity about the X axis acts on the frame 10 vibrating by the basic vibration, a Coriolis force F1 is generated in each of the pendulum portions 21a to 21d in directions orthogonal to the vibration directions thereof at that instant as shown in the upper part of FIG. 7. Accordingly, the set of pendulum portions 21a and 21b adjacent to each other in the X-axis direction are deformed in a positive direction of the Z axis by the Coriolis force F1, and deformation amounts thereof are detected by the piezoelectric detection units 71a and 71b. In addition, the other set of pendulum portions 21c and 21d adjacent to each other in the X-axis direction are deformed in a negative direction of the Z axis by the Coriolis force F1, and deformation amounts thereof are detected by the piezoelectric detection units 71c and 71d.

On the other hand, when an angular velocity about the Y axis acts on the frame 10 vibrating by the basic vibration, a Coriolis force F2 is generated in each of the pendulum portions 21a to 21d in directions orthogonal to the vibration directions thereof at that instant as shown in the lower part of FIG. 7. Accordingly, the set of pendulum portions 21a and 21d adjacent to each other in the Y-axis direction are deformed in the negative direction of the Z axis by the Coriolis force F2, and deformation amounts thereof are detected by the piezoelectric detection units 71a and 71d. In addition, the other set of pendulum portions 21b and 21c adjacent to each other in the Y-axis direction are deformed in the positive direction of the Z axis by the Coriolis force F2, and deformation amounts thereof are detected by the piezoelectric detection units 71b and 71c.

Also when angular velocities are generated about the axes in directions obliquely intersecting the X axis and the Y axis, respectively, the angular velocities are detected by a principle similar to that described above. Specifically, the pendulum portions 21a to 21d are deformed by the Coriolis force corresponding to the X-direction component and Y-direction component of the angular velocities, and deformation amounts thereof are respectively detected by the piezoelectric detection units 71a to 71d. A control circuit of the sensor device extracts the angular velocity about the X axis and the angular velocity about the Y axis on the basis of the outputs of the piezoelectric detection units 71a to 71d. Accordingly, it becomes possible to detect an angular velocity about an arbitrary axis parallel to the XY plane.

(1-7. Reference Electrode)

The sensor device 100 of this embodiment includes reference electrodes 61. The reference electrodes 61 are arranged adjacent to the second piezoelectric drive units 32 on the second beams 12a and 12b. The reference electrodes 61 have configurations similar to those of the first and second piezoelectric detection units 51a to 51d and 71a to 71d, are each configured by a laminated body constituted of a lower electrode layer, a piezoelectric film, and an upper electrode layer, and respectively have functions of converting mechanical deformations of the beams 12a and 12b into electric signals. The lower electrode layer is connected to a reference potential such as a ground potential, and the upper electrode layer functions as a detection electrode that outputs a reference signal (FB).

It should be noted that it is also possible to generate a sum signal of the outputs of the first piezoelectric detection units 51a to 51d and use it as the reference signal instead of forming the reference electrodes 61.

(2. Controller)

Figure 8:
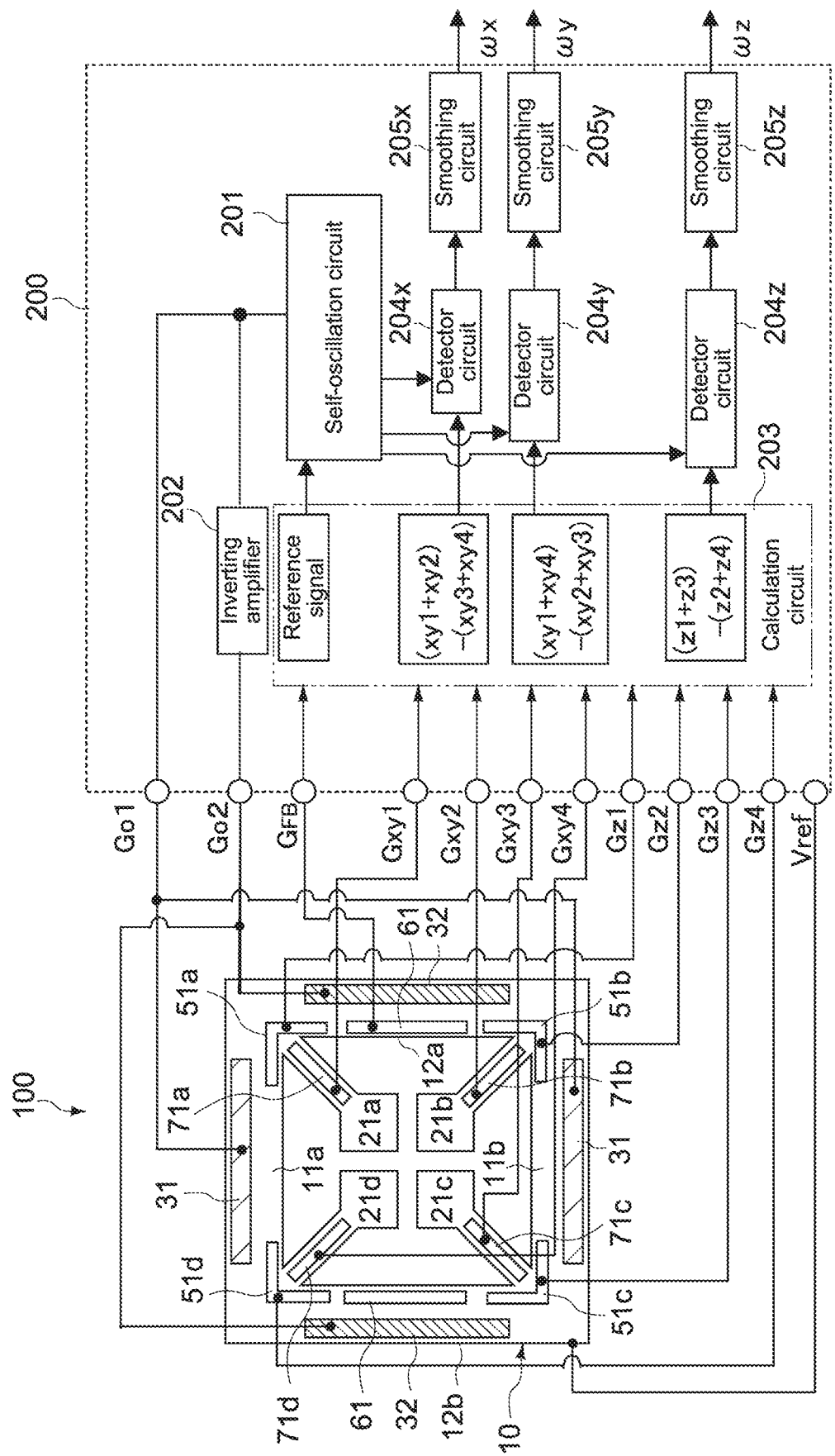
FIG. 8 A block diagram showing a relationship between the sensor device and a controller (circuit device) connected thereto.

Here, details of the controller 200 will be described. FIG. 8 is a block diagram showing a configuration of the controller 200.

The controller 200 includes a self-oscillation circuit 201 and detection circuits (calculation circuit 203, detector circuits 204, and smoothing circuits 205). The self-oscillation circuit 201 generates drive signals for causing the vibrator unit 101 (frame 10, pendulum portions 21a to 21d) to vibrate within the XY plane. The detection circuits generate and output angular velocities about the X, Y, and Z axes on the basis of the detection signals (z1, z2, z3, z4, xy1, xy2, xy3, and xy4) output from the vibrator unit 101.

The controller 200 includes a Go1 terminal, a Go2 terminal, a GFB terminal, a Gxy1 terminal, a Gxy2 terminal, a Gxy3 terminal, a Gxy4 terminal, a Gz1 terminal, a Gz2 terminal, a Gz3 terminal, a Gz4 terminal, and a Vref terminal.

It should be noted that the Gz1 terminal and the Gz3 terminal may be configured by a common terminal, and the Gz2 terminal and the Gz4 terminal may be configured by a common terminal. In this case, wirings connected to the Gz1 terminal and the Gz3 terminal are integrated in the middle, and wirings connected to the Gz2 terminal and the Gz4 terminal are integrated in the middle.

In this embodiment, the Go1 terminal is electrically connected to the upper electrode layer of the first piezoelectric drive units 31 and the lower electrode layer of the second piezoelectric drive units 32. The Go2 terminal is electrically connected to the lower electrode layer of the first piezoelectric drive units 31 and the upper electrode layer (second drive electrode D2) of the second piezoelectric drive units 32. The GFB terminal is electrically connected to the upper electrode layer of the reference electrodes 61.

The Go1 terminal is connected to an output terminal of the self-oscillation circuit 201. The Go2 terminal is connected to an output terminal of the self-oscillation circuit 201 via an inverting amplifier 202. The self-oscillation circuit 201 generates drive signals (AC signals) for driving the first and second piezoelectric drive units 31 and 32. The inverting amplifier 202 generates drive signals (second drive signals G−) that are of the same size as the drive signals (first drive signals G+) generated by the self-oscillation circuit 201 and obtained by inverting the phase 180°. Accordingly, the first and second piezoelectric drive units 31 and 32 extend and contract in mutually-opposite phases. It should be noted that to help understand the figure, the connections between the lower electrode layers of the piezoelectric drive units 31 and 32 and the controller 200 are omitted.

The Gxy1 terminal, the Gxy2 terminal, the Gxy3 terminal, and the Gxy4 terminal are electrically connected to the upper electrode layers (second detection electrodes S2) of the second piezoelectric detection units 71a, 71b, 71c, and 71d, respectively. The Gz1 terminal, the Gz2 terminal, the Gz3 terminal, and the Gz4 terminal are electrically connected to the upper electrode layers (first detection electrodes S1) of the first piezoelectric detection units 51a, 51b, 51c, and 51d, respectively. The Vref terminal is electrically connected to the lower electrode layer of the reference electrodes 61 and the lower electrode layer of the first and second piezoelectric detection units 51a to 51d and 71a to 71d.

The GFB terminal, the Gxy1 terminal, the Gxy2 terminal, the Gxy3 terminal, the Gxy4 terminal, the Gz1 terminal, the Gz2 terminal, the Gz3 terminal, and the Gz4 terminal are connected to input terminals of the calculation circuit 203. The calculation circuit 203 includes a first differential circuit for generating an angular velocity signal about the X axis, a second differential circuit for generating an angular velocity signal about the Y axis, and a third differential circuit for generating an angular velocity signal about the Z axis.

It is assumed that the outputs of the first piezoelectric detection units 51a to 51d are z1 to z4 and the outputs of the second piezoelectric detection units 71a to 71d are xy1 to xy4, respectively. At this time, the first differential circuit calculates (xy1+xy2)−(xy3+xy4) and outputs the calculated value to the detector circuit 204x. The second differential circuit calculates (xy1+xy4)−(xy2+xy3) and outputs the calculated value to the detector circuit 204y. Further, the third differential circuit calculates (z1+z3)−(z2+z4) and outputs the calculated value to the detector circuit 204z.

The detector circuits 204x, 204y, and 204z subject the differential signals to full-wave rectification to obtain DC signals in synchronization with an output of drive signals from the self-oscillation circuit 201 or the reference signal (FB). The smoothing circuits 205x, 205y, and 205z respectively smoothen the outputs of the detector circuits 204x, 204y, and 204z. A DC voltage signal ωx output from the smoothing circuit 205x includes information on the magnitude and direction of the angular velocity about the X axis, and a DC voltage signal ωy output from the smoothing circuit 205y includes information on the magnitude and direction of the angular velocity about the Y axis. Similarly, a DC voltage signal ωz output from the smoothing circuit 205z includes information on the magnitude and direction of the angular velocity about the Z axis.

Specifically, the magnitudes of the DC voltage signals ωx, ωy, and ωz with respect to the reference potential Vref correspond to information on the angular velocity magnitudes, and polarities of the DC voltage signals correspond to information on the angular velocity directions.

(3. Frame Body)

Next, the frame body 102 of the sensor device 100 will be described.

As shown in FIG. 2, the frame body 102 includes the annular base portion 81 arranged around the vibrator unit 101 and the coupling portions 82 arranged between the vibrator unit 101 and the base portion 81.

(3-1. Base Portion)

The base portion 81 is constituted of a square frame body surrounding the outer side of the vibrator unit 101. The base portion 81 includes a rectangularly-annular main surface 81s formed on the same plane as the main surface 10s of the frame 10, and a plurality of terminal portions (electrode pads) 810 to be electrically connected to the controller 200 are provided on the main surface 81s. A surface on the other side of the main surface 81s is bonded to the support layer W2 via the bonding layer W3. The support layer W2 is constituted of a frame body similar to that of the base portion 81 and partially supports the base portion 81.

The terminal portions 810 are electrically and mechanically connected to a plurality of lands on the controller 200 via bumps (not shown). In other words, the sensor device 100 of this embodiment is mounted on the circuit device 1 by a flip-chip method. It should be noted that it is also possible to electrically and mechanically connect the electrode pads and the circuit device simply by solder melting or the like without using bumps.

Further, a wire bonding method may be used for mounting the sensor device 100. In this case, the sensor device 100 is mechanically connected by adhesion or the like so that the sensor device 100 becomes backwards with respect to the controller 200, that is, the plurality of terminal portions 810 face upwards. After that, the terminal portions 810 are electrically connected to the controller 200 by bonding wires.

(3-2. Coupling Portions)

The coupling portions 82 include a plurality of coupling portions 82a, 82b, 82c, and 82d that support the vibrator unit 101 while enabling the vibrator unit 101 to vibrate with respect to the base portion 81. The coupling portions 82a to 82d respectively extend from the connection portions 13a to 13d of the frame 10 toward the base portion 81. The coupling portions 82a to 82d each include a first end portion 821 connected to the vibrator unit 101 and a second end portion 822 connected to the base portion 81 and are deformable mainly within the XY plane due to vibrations of the frame 10. In other words, the coupling portions 82a to 82d function as suspensions that support the vibrator unit 101 while enabling the vibrator unit 101 to vibrate.

The coupling portions 82a to 82d each include a main surface 82s (second main surface) parallel to the main surface 10s of the frame 10 and the main surface 81s of the base portion 81, and the main surface 82s is typically constituted of the same plane as the main surfaces 10s and 81s. In other words, the coupling portions 82a to 82d of this embodiment are each constituted of a silicon substrate that is the same as that constituting the vibrator unit 101.

The coupling portions 82*a* to 82*d* are typically formed in shapes symmetrical with respect to the X axis and the Y axis. Accordingly, the deformation direction of the frame 10 within the XY plane becomes isotropic, and it becomes possible to highly-accurately detect angular velocities about the respective axes without causing distortions and the like in the frame 10.

The shapes of the coupling portions 82*a* to 82*d* may either be linear or nonlinear. As shown in FIG. 2, the coupling portions 82*a* to 82*d* of this embodiment each include an inversion portion 820 where an extension direction is inverted approximately 180° between the vibrator unit 101 and the base portion 81. By elongating the extension length of the coupling portions 82*a* to 82*d* in this way, it becomes possible to support the vibrator unit 101 without inhibiting the vibration of the vibrator unit 101. Furthermore, an effect that an external vibration (impact) is not transmitted to the vibrator unit 101 is also obtained.

The coupling portions 82*a* to 82*d* can be optimized according to the shape of the frame 10. For example, a frame 110 according to another embodiment is shown in FIG. 9.

Figure 9:
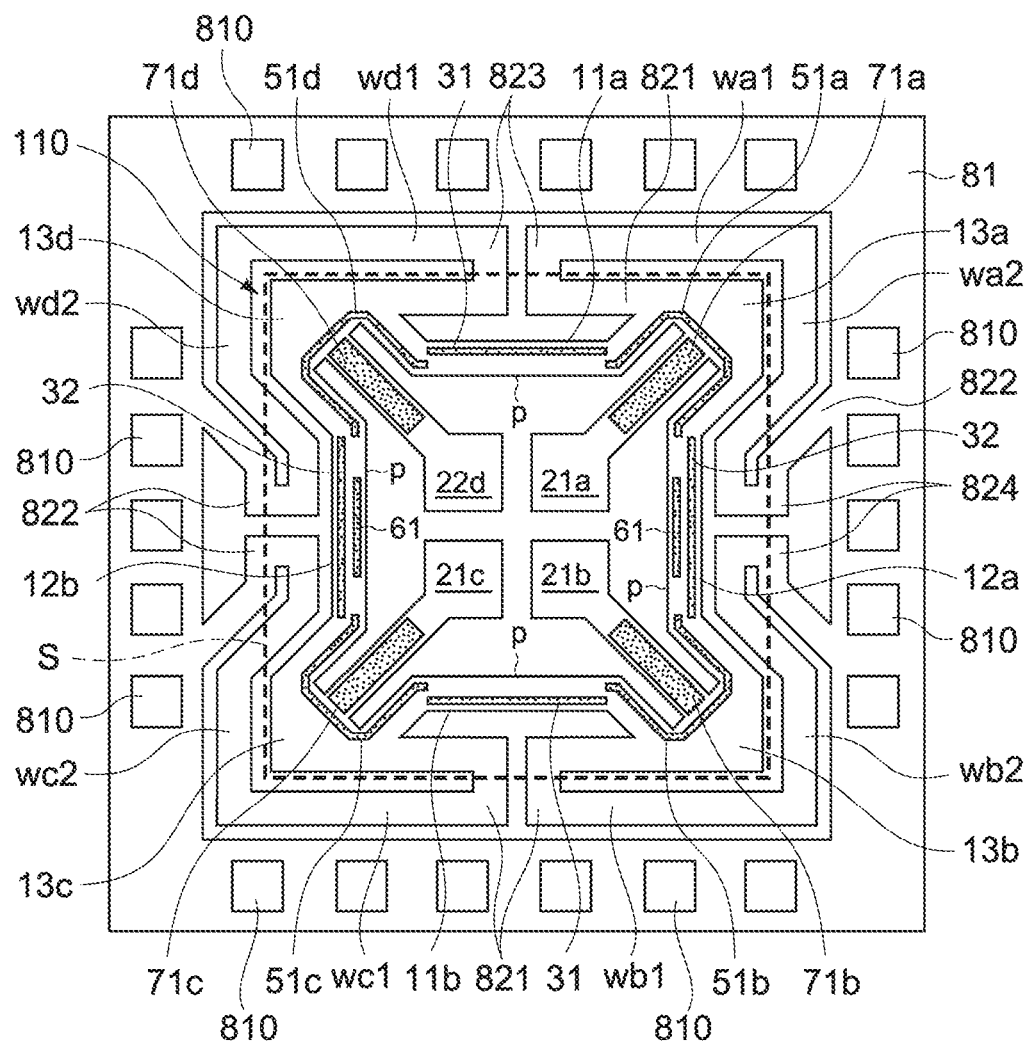
FIG. 9 A schematic plan view showing another configuration example of the sensor device.

In the frame 110 shown in FIG. 9, the set of first beams 11*a* and 11*b* and the set of second beams 12*a* and 12*b* each include a protrusion p that protrudes toward an inner side of a quadrate S that has the connection portions 13*a* to 13*d* as apexes and are each formed in an arch as a whole. The beams 11*a*, 11*b*, 12*a*, and 12*b* include the protrusions p and tilt potions v that fix both ends of the protrusions p to the connection portions 13*a* to 13*d*. The tilt potions v are formed at both ends of the protrusions p and support the protrusions p such that the protrusions p are positioned on the inner side of the quadrate S.

The protrusions p of the first beams 11*a* and 11*b* are formed to be parallel with the a-axis direction and oppose each other in the b-axis direction. The protrusions p of the second beams 12*a* and 12*b* are formed to be parallel with the b-axis direction and oppose each other in the a-axis direction. On the front surface (main surface) of the frame 110 and pendulum portions 21*a* to 21*d*, the first and second piezoelectric drive units 31 and 32, the first and second piezoelectric detection units 51*a* to 51*d* and 71*a* to 71*d*, and the reference electrodes 61 are provided.

Since the beams 11*a*, 11*b*, 12*a*, and 12*b* are each formed in an arch in the frame 110 configured as described above, the beams forming the frame do not become short even when an occupying area of the frame becomes small. Therefore, the resonance frequency of the vibration mode does not largely change. As a result, since a distorted deformation within an ab plane as shown in FIG. 6 is not inhibited when an angular velocity about the c axis (Z axis) acts, for example, the angular velocity detection sensitivity about the c axis (Z axis) can be maintained.

On the other hand, in the embodiment shown in FIG. 9, the coupling portions 82*a* to 82*d* that couple the frame 110 to the base portion 81 are provided. The coupling portions 82*a* to 82*d* each include the first end portion 821 that is connected to the vibrator unit (frame 110) and the second end portion 822 that is connected to the base portion 81 (denoted only for coupling portion 82*a* in FIG. 9).

The coupling portions 82*a* to 82*d* include first inversion portions wa1, wb1, wc1, and wd1 and second inversion portions wa2, wb2, wc2, and wd2. The first inversion portions wa1 to wd1 have one ends respectively coupled to the connection portions 13*a* to 13*d* and include inversion portions 823 that are bent approximately 180° in the a-axis direction. On the other hand, the second inversion portions wa2 to wd2 have one ends respectively coupled to the other end portions of the first inversion portions wa1 to wd1 and include inversion portions 824 that are bent approximately 180° in the b-axis direction. The other ends of the second inversion portions wa2 to wd2 are connected to the base portion 81.

At this time, as shown in FIG. 9, the second inversion portions wa2 to wd2 are partially bent toward an outer circumferential side of the protrusions p of the second beams 12*a* and 12*b* so that the inversion portions 823 are set on the inner side of the quadrate S forming the outer shape of the frame 110. By designing at least a part of the coupling portions 82*a* to 82*d* in accordance with the outer shape of the frame 110 in this way, the extension length of the coupling portions 82*a* to 82*d* can be increased without enlarging the base portion 81.

(3-3. Wiring Layers)

Figure 10:
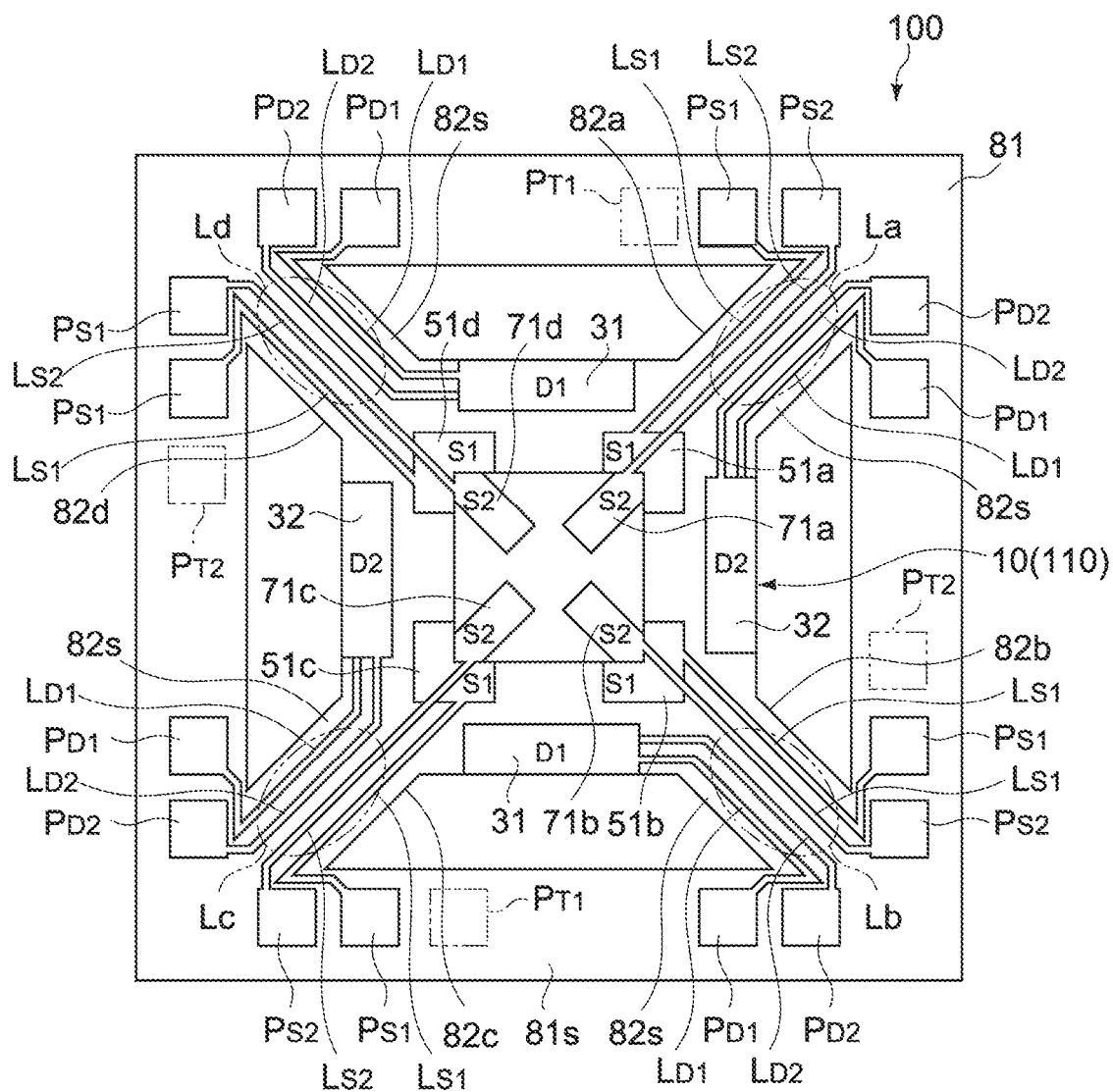
FIG. 10 A schematic plan view for explaining a wiring layout of the sensor device.
Figure 11:
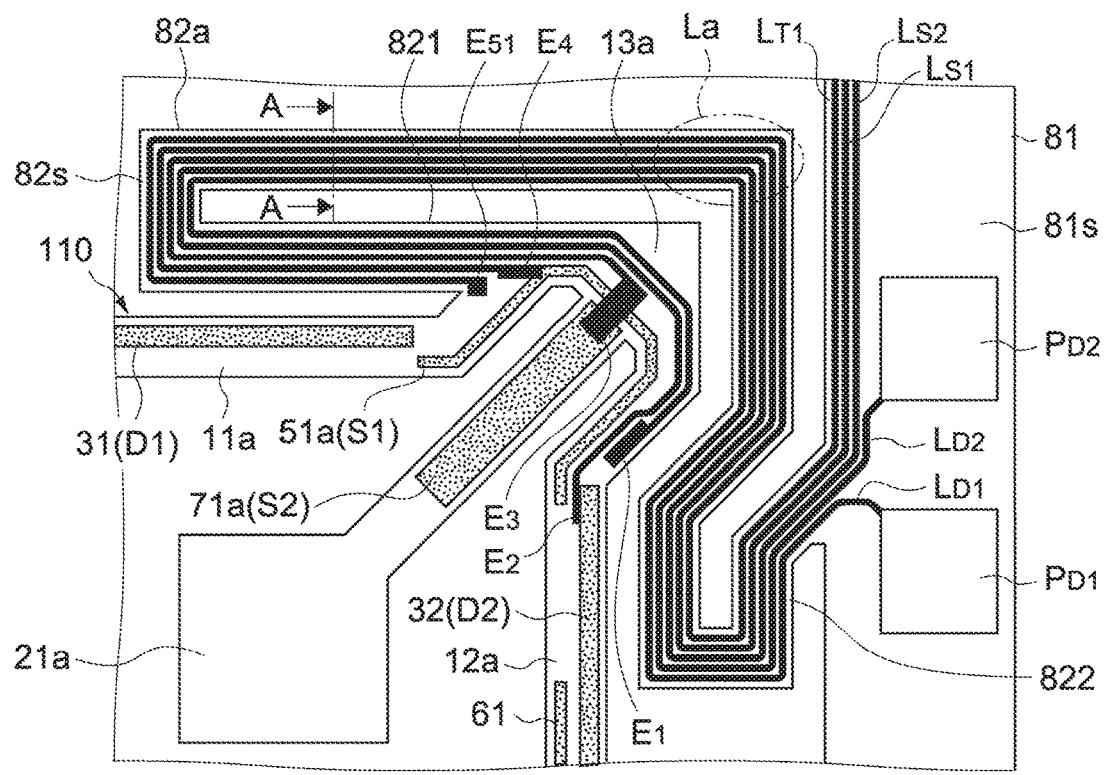
FIG. 11 A schematic plan view of a main portion, that shows a configuration of a wiring layer in the sensor device.
Figure 12:
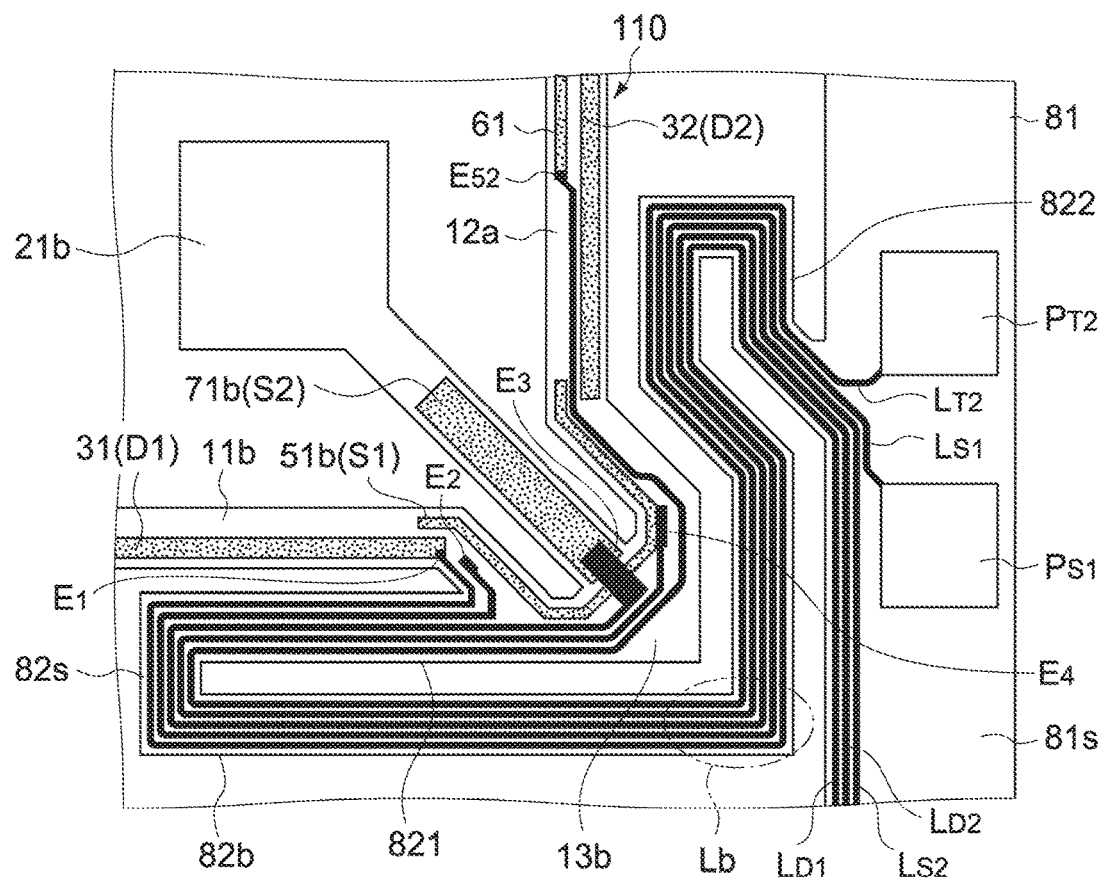
FIG. 12 A schematic plan view of another main portion, that shows a configuration of the wiring layer in the sensor device.
Figure 13:
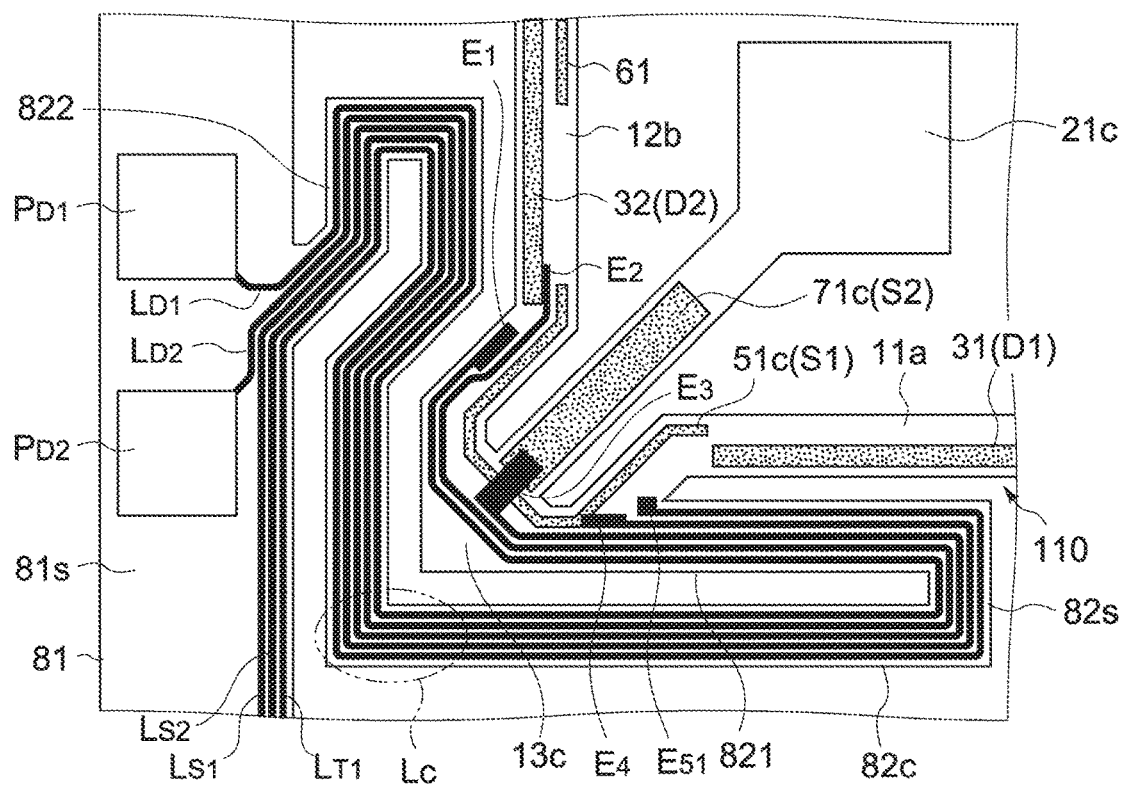
FIG. 13 A schematic plan view of still another main portion, that shows a configuration of the wiring layer in the sensor device.
Figure 14:
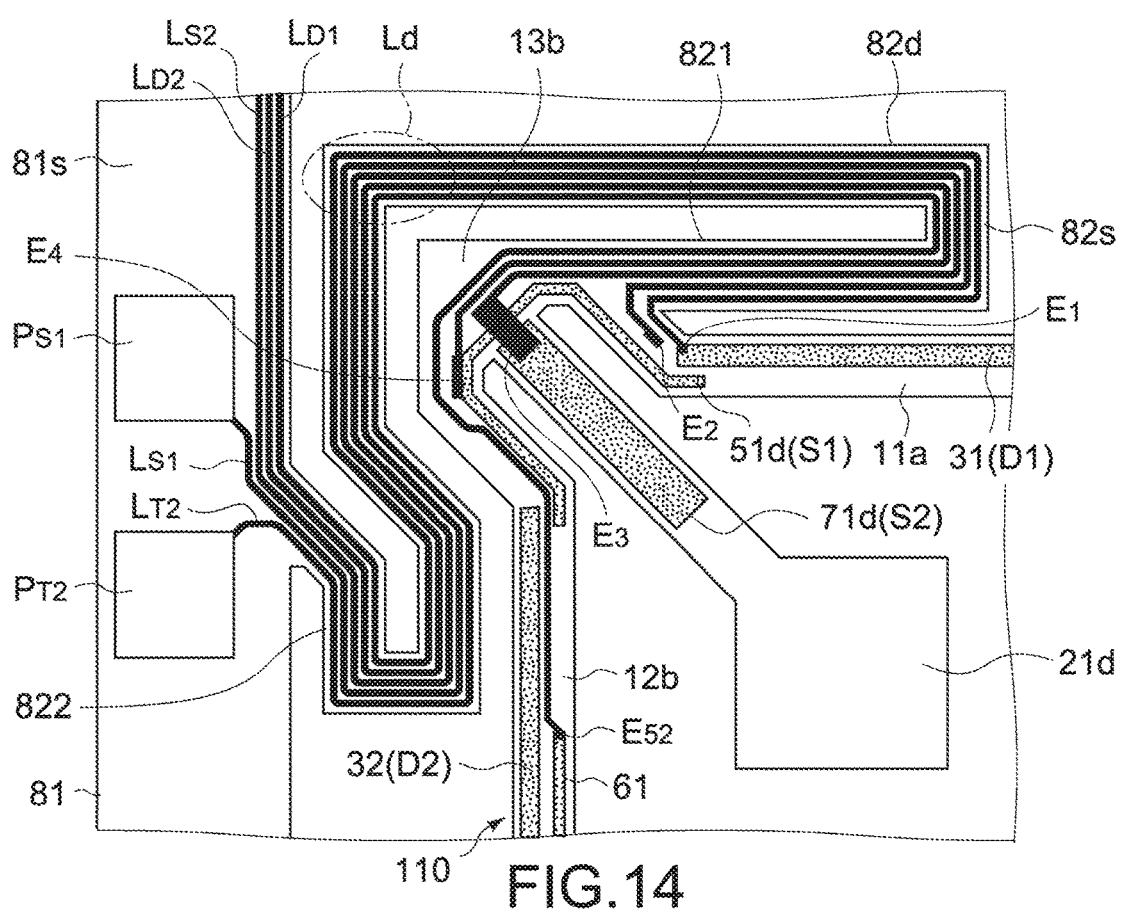
FIG. 14 A schematic plan view of still another main portion, that shows a configuration of the wiring layer in the sensor device.

The frame body 102 further includes wiring layers that electrically connect the plurality of terminal portions 810 on the base portion 81 with the drive electrodes (D1 and D2) and detection electrodes (S1, S2, and 61) on the frame 10 (110). FIG. 10 is a schematic plan view for explaining a wiring layout of the sensor device 100.

As shown in FIG. 10, wiring layers La, Lb, Lc, and Ld are respectively provided on the main surfaces 82*s* of the coupling portions 82*a* to 82*d*. The wiring layers La to Ld each include a plurality of drive wirings and a plurality of detection wirings.

The plurality of drive wirings include a first drive wiring LD1 and a second drive wiring LD2. One end of each of the first drive wirings LD1 is connected to the first drive electrodes D1, that is, the upper electrode layer 305 of the first piezoelectric drive units 31 and the lower electrode layer 303 of the second piezoelectric drive units 32. One end of each of the second drive wirings LD2 is connected to the second drive electrodes D2, that is, the lower electrode layer 303 of the first piezoelectric drive units 31 and the upper electrode layer 305 of the second piezoelectric drive units 32.

On the other hand, the plurality of detection wirings include a first detection wiring LS1 and a second detection wiring LS2. One end of each of the first detection wirings LS1 is connected to the first detection electrodes S1, that is, the upper electrode layers of the first piezoelectric detection units 51*a* to 51*d*. One end of each of the second detection wirings LS2 is connected to the second detection electrodes S2, that is, the upper electrode layers of the second piezoelectric detection units 71*a* to 71*d*.

As shown in FIG. 10, the plurality of terminal portions 810 include first drive pads PD1, second drive pads PD2, first detection pads PS1, and second detection pads PS2, and these pads are provided plurally (4 in this example) so as to correspond to the coupling portions 82*a* to 82*d*. The first and second drive pads PD1 and PD2 are respectively connected to the other ends of the first and second drive wirings LD1 and LD2, and the first and second detection pads PS1 and PS2 are respectively connected to the other ends of the first and second detection wirings LS1 and LS2.

Figure 15:
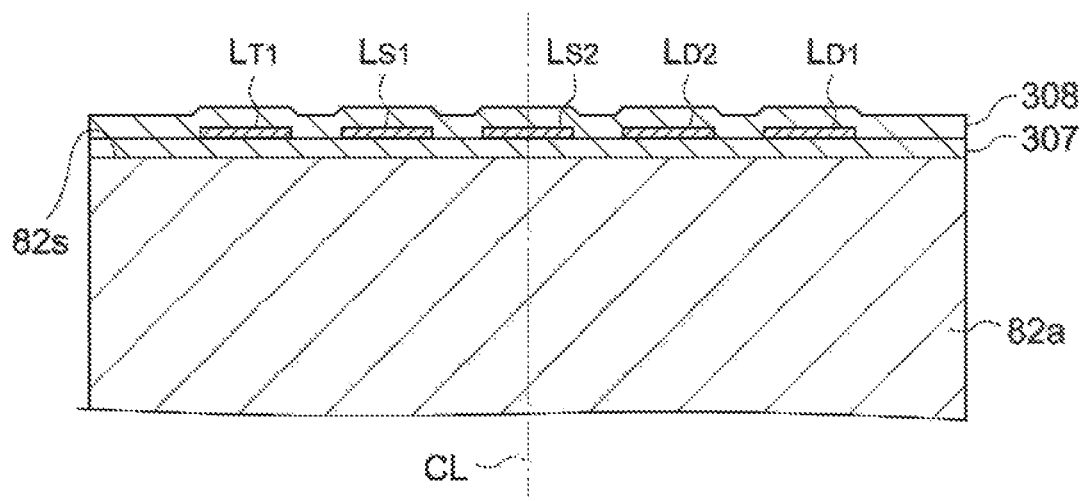
FIG. 15 A cross-sectional diagram taken along the line A-A of FIG. 11.

FIGS. 11 to 14 are schematic plan views of a main portion, that respectively show details of the wiring layers La to Ld in the coupling portions 82*a* to 82*d*. FIG. 15 is a cross-sectional diagram taken along the line A-A of FIG. 11.

As shown in FIGS. 11 to 15, the various wirings configuring the wiring layer La include the first and second drive wirings LD1 and LD2, the first and second detection wirings LS1 and LS2, and a reference potential connection wiring LT1 or a reference electrode connection wiring LT2.

The first drive wirings LD1 individually connect the first drive pads PD1 provided on the base portion 81 and terminal portions E1 provided on the frame 110. The first drive pads PD1 are each electrically connected to the Go1 terminal of the controller 200, and the terminal portions E1 are electrically connected to the first drive electrodes D1. In other words, the terminal portions E1 are connected to the lower electrode layers of the second piezoelectric drive units 32 at the coupling portions 82a and 82c and connected to the upper electrode layers of the first piezoelectric drive units 31 at the coupling portions 82b and 82d. Accordingly, the first drive signals (G+) can be input to the first drive electrodes D1.

The second drive wirings LD2 individually connect the second drive pads PD2 provided on the base portion 81 and terminal portions E2 provided on the frame 110. The second drive pads PD2 are each electrically connected to the Go2 terminal of the controller 200, and the terminal portions E2 are electrically connected to the second drive electrodes D2. In other words, the terminal portions E2 are connected to the upper electrode layers of the second piezoelectric drive units 32 at the coupling portions 82a and 82c and connected to the lower electrode layers of the first piezoelectric drive units 31 at the coupling portions 82b and 82d. Accordingly, the second drive signals (G−) can be input to the second drive electrodes D2.

The first detection wirings LS1 individually connect the first detection pads PS1 provided on the base portion 81 and terminal portions E4 provided on the frame 110. The first detection pads PS1 are electrically connected to the Gz1 to Gz4 terminals of the controller 200, and the terminal portions E4 are electrically connected to the first detection electrodes S1 (upper electrode layers of first piezoelectric detection units 51a to 51d). Accordingly, detection signals (z1 to z4) on the angular velocity about the Z axis, that has been detected by the first piezoelectric detection units 51a to 51d, can be output to the controller 200.

The second detection wirings LS2 individually connect the second detection pads PS2 provided on the base portion 81 and terminal portions E3 provided on the frame 110. The second detection pads PS2 are electrically connected to the Gxy1 to Gxy4 terminals of the controller 200, and the terminal portions E3 are electrically connected to the second detection electrodes S2 (upper electrode layers of second piezoelectric detection units 71a to 71d). The terminal portions E3 each include a jumper function of bridging over the first piezoelectric detection units 51a to 51d and are connected to the second piezoelectric detection units 71a to 71d without being brought into contact with the first piezoelectric detection units 51a to 51d. Accordingly, detection signals (xy1 to xy4) on the angular velocities about the X axis and Y axis, that have been detected by the second piezoelectric detection units 71a to 71d, can be output to the controller 200.

The reference potential connection wirings LT1 are provided on the main surface 82s of the coupling portions 82a and 82c and connect reference potential connection pads PT1 provided on the base portion 81 and terminal portions E51 provided on the frame 110. The reference potential connection pads PT1 constitute a part of the plurality of terminal portions 810 provided on the base portion 81 and are electrically connected to the Vref terminal of the controller 200. The terminal portions E51 are electrically connected to the lower electrode layers of the first piezoelectric detection units 51a to 51d, the lower electrode layers of the second piezoelectric detection units 71a to 71d, and the lower electrode layers of the reference electrodes 61. Accordingly, a reference potential can be input to the respective lower electrode layers.

The reference electrode connection wirings LT2 are provided on the main surface 82s of the coupling portions 82b and 82d and connect reference electrode connection pads PT2 provided on the base portion 81 and terminal portions E52 provided on the frame 110. The reference electrode connection pads PT2 constitute a part of the plurality of terminal portions 810 provided on the base portion 81 and are electrically connected to the GFB terminal of the controller 200. The terminal portions E52 are electrically connected to the upper electrode layers of the reference electrodes 61. Accordingly, reference signals (FB) detected by the reference electrodes 61 can be output to the controller 200.

The various wirings constituting the wiring layers La to Ld are formed on the main surface 82s of the coupling portions 82a to 82d via an insulation film 307 and covered by a protection film 308 laminated on the insulation film 307 (see FIG. 15). The insulation film 307 covers the first and second piezoelectric drive units 31 and 32, the first piezoelectric detection units 51a to 51d, the reference electrodes 61, and the like, and the wirings are electrically connected to the respective electrode layers via via-holes formed on the insulation film 307. The type of insulation film 307 is not limited in particular and may be an alumina film, a silicon oxide film, or a laminated film of those, for example.

As shown in FIGS. 10 to 15, the wiring layers La to Ld are configured such that the plurality of drive wirings (LD1 and LD2) are arranged adjacent to and parallel to each other on the main surface 82s of each of the coupling portions 82a to 82d and the plurality of detection wirings (LS1 and LS2) are arranged adjacent to and parallel to each other on the main surface 82s of each of the coupling portions 82a to 82d. Accordingly, the wirings can be routed without crossing one another. Further, it becomes possible to reduce crosstalk among the plurality of drive wirings and plurality of detection wirings arranged on the same coupling portions 82a to 82d and highly-accurately detect angular velocities about the respective axes.

In this embodiment, the plurality of drive wirings (LD1 and LD2) are unevenly arranged on one side (right-hand side in this example) of the main surface 82s of the coupling portions 82a to 82d from the first end portion 821 toward the second end portion 822 as shown in FIGS. 11 to 14. On the other hand, the plurality of detection wirings (LS1 and LS2) are unevenly arranged on the other side (left-hand side in this example) of the main surface 82s from the first end portion 821 toward the second end portion 822.

The first drive wiring LD1 is arranged more on the outer side than the second drive wiring LD2, and the second drive wiring LD2 is arranged between the first and second detection wirings LS1 and LS2 and the first drive wiring LD1. The positional relationship between the first and second drive wirings LD1 and LD2 is not limited to the example described above, and the second drive wiring LD2 may be arranged more on the outer side than the first drive wiring LD1.

It should be noted that by uniformizing the type of drive wirings adjacent to the detection wirings LS1 and LS2 in the wiring layers La to Ld, polarities of drive signals leaking into the detection wirings become the same, with the result that even when crosstalk among the drive wirings and detection wirings is caused, noise components are efficiently canceled in the process of calculating angular velocities about the respective axes as will be described later.

Regarding the first and second detection wirings LS1 and LS2, it is desirable for the detection wiring connected to one of the first and second detection electrodes S1 and S2 having a larger electrode capacity to be arranged adjacent to the plurality of drive wirings (LD1 and LD2). The detection wiring connected to the detection electrode having a larger electrode capacity has a lower impedance than other detection wirings and is difficult to be influenced by noises, so crosstalk with the drive wirings can be made small. In this embodiment, the second detection wiring LS2 is arranged between the first detection wiring LS1 and the second drive wiring LD2.

The positional relationship between the first and second drive wirings LD1 and LD2 and the positional relationship between the first and second detection wirings LS1 and LS2 are common to the coupling portions 82a to 82d. Accordingly, even when crosstalk among the drive wirings and detection wirings is caused, noise components are efficiently canceled in the process of calculating angular velocities about the respective axes as will be described later.

On the other hand, the reference potential connection wiring LT1 and the reference electrode connection wiring LT2 are arranged adjacent to the first detection wiring LS1. By arranging the reference potential connection wiring LT1 and the reference electrode connection wiring LT2 at a position farthest from the first and second drive wirings LD1 and LD2, it becomes possible to suppress entering of drive signals into those wirings and stably maintain an oscillation property.

The various wirings configuring the wiring layers La to Ld (drive wirings LD1 and LD2, detection wirings LS1 and LS2, reference potential connection wiring LT1, and reference electrode connection wiring LT2) typically have the same line width (e.g., 5 μm). In addition, the various wirings are arranged symmetrical with respect to a center line CL of each of the plurality of coupling portions 82a to 82d and at regular intervals (e.g., 3 μm) on the main surface 82s. Accordingly, since a mechanical symmetric property of the vibrator unit 101 is maintained, the coupling portions 82a to 82d can equally support the vibrator unit 101 within the XY plane, and twists of the vibrator unit 101 can be suppressed even when a force in the Z-axis direction is applied.

In this embodiment, since the number of wirings configuring the wiring layers La to Ld is an odd number (5 in this example), the center of the wiring positioned at the center (second detection wiring LS2 in this example) is aligned on the center line CL of each of the coupling portions 82a to 82d as shown in FIG. 15. On the other hand, when the number of wirings is an even number, the wirings are formed such that the center line CL is positioned between two wirings at the center.

Further, the various wirings configuring the wiring layers La to Ld (drive wirings LD1 and LD2, detection wirings LS1 and LS2, reference potential connection wiring LT1, and reference electrode connection wiring LT2) may be formed of the same material as the electrode layers of the drive electrodes D1 and D2, the detection electrodes S1 and S2, the reference electrodes, and the like, or may be formed of different materials. In this embodiment, the various wirings are each formed of a material having a smaller elastic modulus (e.g., Au (gold), Al (aluminum), Ag (silver), etc.) than the materials forming the electrode layers (e.g., Pt (platinum), Ir (iridium), etc.). The various wirings may alternatively be constituted of a laminated film of Au/Ti (titanium) and the like.

Accordingly, since the coupling portions 82a to 82d are apt to be elastically deformed, the vibrator unit 101 can be supported without inhibiting vibrations of the vibrator unit 101 or without causing vibrations of the vibrator unit 101 to leak out to the base portion 81. Moreover, an influence of a deviation of the symmetric property that is due to a deviation of wiring patterns can be made small. Furthermore, since disconnection, deterioration, and the like of the various wiring layers are suppressed, reliability of the sensor device 100 can be secured for a long period of time.

It should be noted that constituent materials of the various pads configuring the plurality of terminal portions 810 (drive pads PD1 and PD2, detection pads PS1 and PS2, etc.) are not limited in particular, and the various pads may be formed of the same material as the respective electrode layers or wirings described above or may be formed of different materials.

Furthermore, it is favorable to form the protection film 308 that covers the various wirings configuring the wiring layers La to Ld (drive wirings LD1 and LD2, detection wirings LS1 and LS2, reference potential connection wiring LT1, and reference electrode connection wiring LT2) of a material having a relatively-low elastic modulus. In this embodiment, the protection film 308 is formed of an organic film. The organic material configuring the protection film 308 is not limited in particular and is typically formed of polyimide. The protection film 308 is not limited to the case of being constituted of an organic film and may alternatively be formed of an inorganic film such as an alumina film, a silicon oxide film, and a laminated film of those, for example.

[Typical Operations of Sensor Device]

In the sensor device 100 of this embodiment, the vibrator unit 101 is supported by the base portion 81 via the plurality of coupling portions 82a to 82d, and the plurality of piezoelectric drive units 31 and 32 cause the frame 10 (110) and the plurality of pendulum portions 21a to 21d to vibrate in mutual sync within a plane parallel to the main surface 10s.

In this state, as an angular velocity about the Z axis acts on the frame 10 (110), a Coriolis force is generated with respect to the frame 10 (110) in directions orthogonal to the vibration directions at that instant so that the frame is deformed within the plane parallel to the main surface 10s as shown in FIG. 6, for example. The plurality of first piezoelectric detection units 51a to 51d output detection signals corresponding to the angular velocity about the Z axis on the basis of the deformation amount of the frame.

On the other hand, as angular velocities about the X axis and the Y axis act, a Coriolis force is generated with respect to the plurality of pendulum portions 21a to 21d in directions orthogonal to the vibration directions at that instant so that the pendulum portions are deformed in a direction vertical to the main surface 10s as shown in FIG. 7, for example. The plurality of second piezoelectric detection units 71a to 71d output detection signals corresponding to the angular velocities about the X axis and the Y axis on the basis of the deformation amounts of the pendulum portions.

Incidentally, in recent years, along with miniaturization and thinning of electronic apparatuses, further miniaturization and multifunctionality of various components and sensors to be mounted on the electronic apparatuses are being demanded. The gyro sensor is required to be not only compact but also capable of highly-accurately detecting angular velocities in multiaxial directions using a single sensor.

In this regard, in the sensor device 100 of this embodiment, the plurality of drive wirings LD1 and LD2 configuring a part of the wiring layers La to Ld respectively provided on the coupling portions 82a to 82d are arranged adjacent to each other. Therefore, crosstalk among the plurality of detection wirings LS1 and LS2 arranged on the same coupling portion can be reduced, and the angular velocities about the respective axes can be detected with high accuracy. Moreover, the wirings can be routed without crossing one another.

Especially in this embodiment, the plurality of drive wirings LD1 and LD2 are unevenly arranged on one side of the main surface 82s from the first end portion 821 toward the second end portion 822, and the plurality of detection wirings LS1 and LS2 are unevenly arranged on the other side of the main surface 82s from the first end portion 821 toward the second end portion 822. Accordingly, it becomes possible to form the plurality of drive wirings LD1 and LD2 and detection wirings LS1 and LS2 on the same plane of each of the coupling portions and reduce crosstalk of signals among the drive wirings LD1 and LD2 and detection wirings LS1 and LS2 arranged on the same plane. Therefore, according to the sensor device 100 of this embodiment, it becomes possible to miniaturize the device and suppress lowering of angular velocity detection accuracy.

Further, in the sensor device 100 of this embodiment, the plurality of drive wirings LD1 and LD2 and detection wirings LS1 and LS2 are arranged mutually symmetrical with respect to the center line CL of each of the plurality of coupling portions and at regular intervals on the main surface 82s of each of the coupling portions 82a to 82d. Accordingly, since a mechanical symmetric property of the vibrator unit 101 is maintained, the vibrator unit 101 can be stably vibrated in a predetermined vibration mode without causing twists.

Furthermore, in this embodiment, the relative positional relationships of the drive wirings LD1 and LD2 and detection wirings LS1 and LS2 are configured to be the same in the coupling portions 82a to 82d. In this case, the magnitude and polarity of drive signals leaking into the detection wirings LS1 and LS2 from the drive wirings LD1 and LD2 become of the same level in the coupling portions 82a to 82d. In addition, superimposed noise components are removed by the detection signal differential calculation by the calculation circuit 203 (see FIG. 8) of the controller 200. Therefore, even crosstalk among the drive wirings LD1 and LD2 and detection wirings LS1 and LS2 is caused, noise components can be efficiently canceled in the process of calculating angular velocities about the respective axes.

As a comparison, in a case where the second detection wiring LS2 is arranged adjacent to the drive wirings (LD1 and LD2) regarding the wiring layers La and Lc and the first detection wiring LS1 is arranged adjacent to the drive wirings (LD1 and LD2) regarding the wiring layers Lb and Ld, a crosstalk amount from the drive wirings, that is superimposed on the angular velocity detection signal about the Z axis, was measured to be about −66.8 dB.

As described above, leakage of drive signals to detection signals lead to output offsets, and a fluctuation of the drive signal level becomes a fluctuation of the gyro output. The amplitude of drive signals varies depending on temperature, and this becomes the fluctuation of the gyro output.

Figure 16:
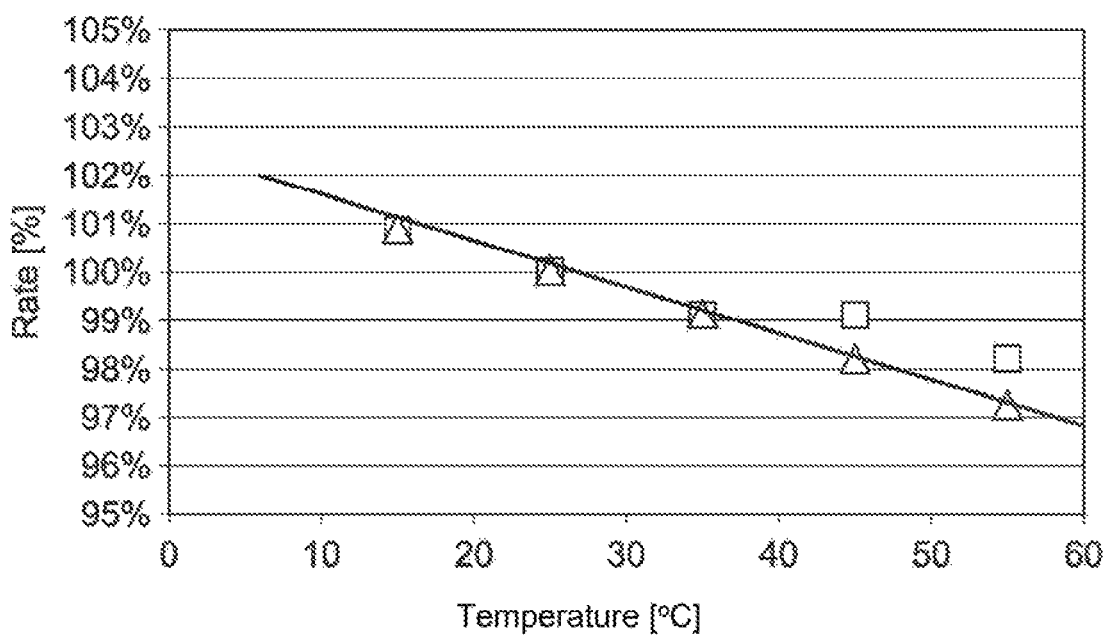
FIG. 16 An experimental result showing a temperature dependency of a drive signal amplitude.

FIG. 16 shows an example of the temperature dependency of the drive signal amplitude. As shown in FIG. 16, the drive signal amplitude varies about 5% with a temperature difference of 50° C. When an operating temperature range is set to be −10° C. to 75° C., for example, the drive signal amplitude varies out 8%.

Figure 17:
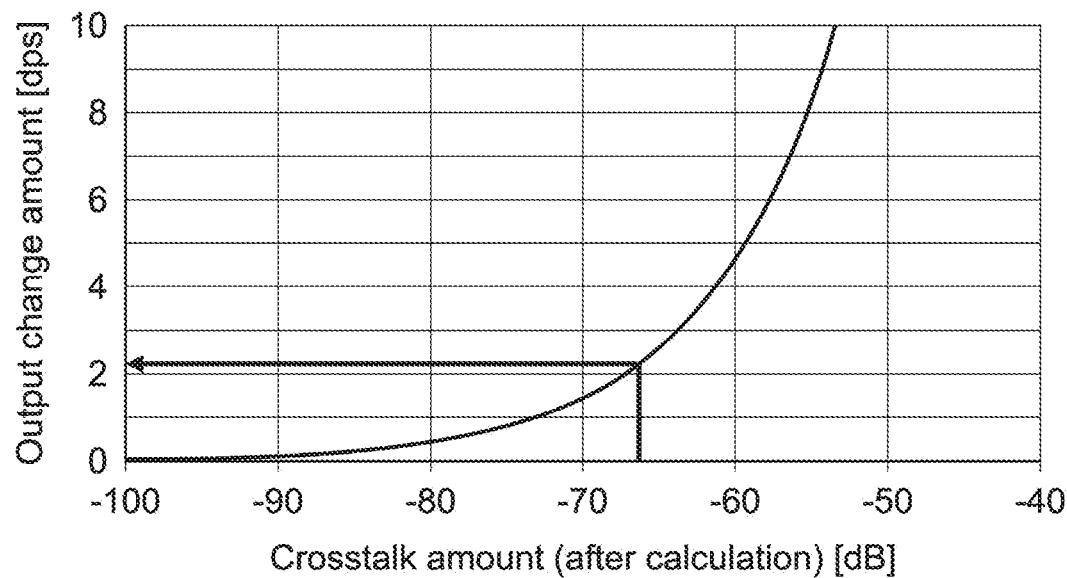
FIG. 17 An experimental result showing a relationship between a crosstalk amount and output change amount at a time the drive signal changes 8%.

FIG. 17 is an experimental result showing a relationship between the crosstalk amount and the output change amount at the time the drive signal varies 8%. When the drive signal amplitude varies 8% in a case where the drive signal amplitude is 3 Vpp and the crosstalk amount is −66.8 dB, a fluctuation amount of the DC voltage signal (ωz) output from the smoothing circuit 205z (see FIG. 8) of the controller 200 corresponds to about 2.1 dps (degree per second). This value gives a considerable influence on a target specification as the entire sensor module.

In contrast, since the relative positional relationships of the wirings groups in the wiring layers La to Ld are the same in this embodiment, the crosstalk amount can be canceled almost completely. Accordingly, angular velocity detection accuracy is improved, and a gyro sensor having high reliability can be provided.

Furthermore, since the second detection wiring LS2 connected to the second detection electrode S2 out of the first and second detection wirings LS1 and LS2 is arranged adjacent to the second drive wiring LD2 in this embodiment, an influence of crosstalk with the drive wirings LD1 and LD2 can be further reduced.

Specifically, since the electrode area of the second detection electrode S2 is larger than that of the first detection electrode S1 in this embodiment, the second detection electrode S2 has a larger electrode capacity than the first detection electrode S1. Typically, as the electrode capacity becomes larger, an impedance of wirings connected thereto becomes lower, and thus it becomes difficult for the wirings to be influenced by noises.

Figure 18:
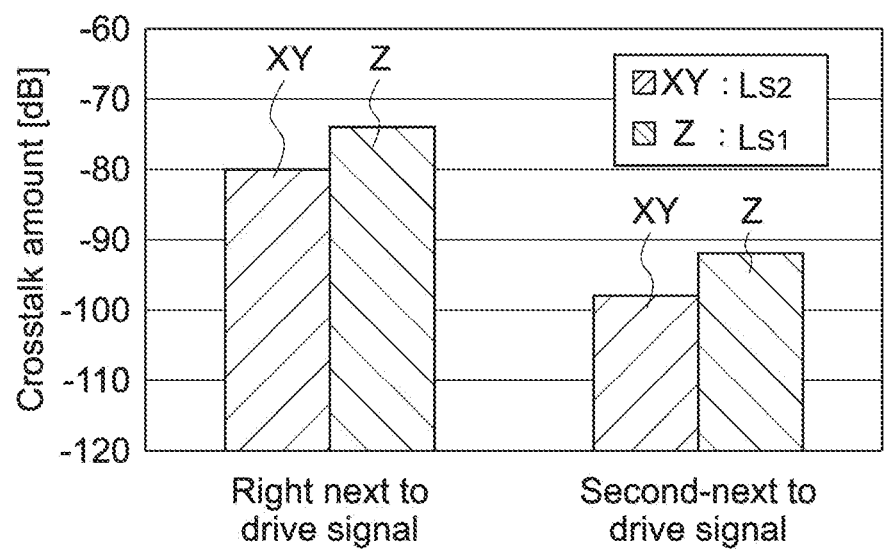
FIG. 18 An experimental result showing a relationship between a relative position of the drive wiring and detection wiring in the wiring layer and a crosstalk amount.

For example, FIG. 18 is an experimental result showing the crosstalk amount from the drive wiring to the detection wiring. In the experiment, while exchanging the positions of the first and second detection wirings LS1 and LS2, a case where the detection wirings are arranged right next to the drive wiring (LD2) and a case where the detection wirings are arranged second-next to the second drive wiring (LD2) were evaluated. The electrode capacity of the first detection electrode S1 was 15 pF, and the electrode capacity of the second detection electrode S2 was 30 pF. As a result, it can be understood from the figure that a leakage amount of drive signals is larger in the first detection wiring LS1 having a relatively-small electrode capacity. Moreover, it was also confirmed that the leakage amount of drive signals is larger in the wirings closer to the drive wiring. From this, by keeping the detection wiring LS1 for detecting an angular velocity about the Z axis as far as possible from the drive wirings, an influence of crosstalk can be suppressed to be small.

As described above, in this embodiment, the second detection wiring LS2 that has a lower impedance and is more difficult to be influenced by noises out of the first and second detection wirings LS1 and LS2 is arranged adjacent to the drive wirings LD1 and LD2. Therefore, the influence of crosstalk can be made small.

The embodiment of the present technology has been described heretofore, but the present technology is not limited to the embodiment above and can of course be variously modified.

Figure 19:
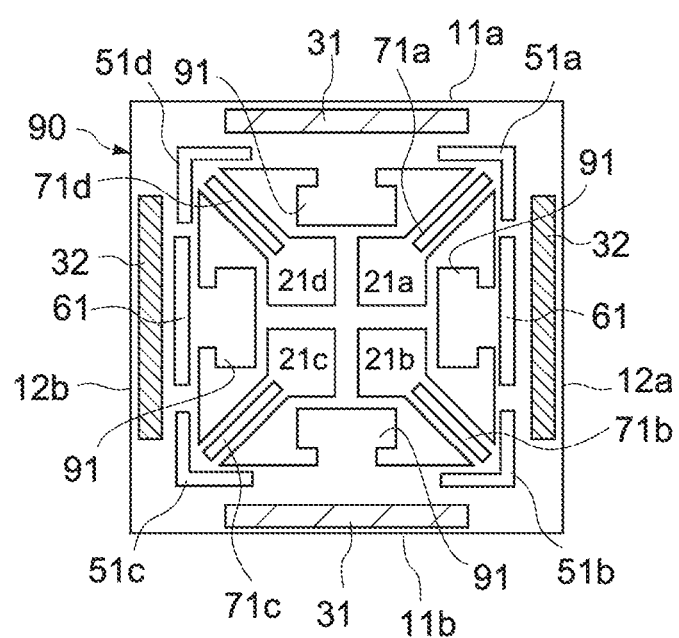
FIG. 19 A schematic plan view showing a modified example of a frame configuration in the sensor device.

For example, although the frame 10 including the configuration as shown in FIG. 3 is described as the vibrator unit 101 in the embodiment above, the present technology is not limited thereto, and the frame may include a configuration as shown in FIG. 19, for example. In a sensor device shown in FIG. 19, a frame 90 includes weight portions 91 formed on inner circumferential portions of the beams 11a, 11b, 12a, and 12b. By setting the shape, size, number, and the like of the weight portions 91 as appropriate, the amplitude, resonance frequency, detuning degree, and the like of the beams 11a, 11b, 12a, and 12b in a basic vibration of the frame 90 can be adjusted with ease.

It should be noted that weight portions similar to those described above may also be provided in the frame 110 shown in FIG. 9.

Furthermore, although the sensor device 100 is mounted on the controller 200 constituted of a circuit device such as an IC chip in the embodiment above, the sensor device 100 may alternatively be directly mounted on other circuit devices such as a control substrate (wiring substrate).

It should be noted that the present technology may also take the following configurations.

(1) A sensor device, including:
a vibrator unit including
an annular frame including a first main surface,
a plurality of pendulum portions each including one end portion supported by the frame,
a plurality of piezoelectric drive units that each include a piezoelectric film and first and second drive electrodes opposing each other while sandwiching the piezoelectric film and cause the frame to vibrate within a plane parallel to the first main surface,
a plurality of first piezoelectric detection units that each include a first detection electrode and detect an angular velocity about a first axis vertical to the first main surface on the basis of a deformation amount of the first main surface of the frame, and
a plurality of second piezoelectric detection units that each include a second detection electrode and detect angular velocities in biaxial directions orthogonal to the first axis on the basis of a deformation amount of the plurality of pendulum portions in a direction vertical to the first main surface;
an annular base portion that includes a plurality of terminal portions and is arranged around the vibrator unit;
a plurality of coupling portions that are arranged between the vibrator unit and the base portion and support the vibrator unit with respect to the base portion in a state where the vibrator unit is capable of vibrating; and
a wiring layer including
a plurality of drive wirings that are respectively connected to the first and second drive electrodes while being adjacent and parallel to one another, and
a plurality of detection wirings that are respectively connected to the first and second detection electrodes while being adjacent and parallel to one another,
the wiring layer being provided at each of the plurality of coupling portions to electrically connect the plurality of terminal portions with the plurality of piezoelectric drive units, first piezoelectric detection units, and second piezoelectric detection units, respectively.

(2) The sensor device according to (1), in which
the plurality of coupling portions include a first end portion connected to the vibrator unit, a second end portion connected to the base portion, and a second main surface that supports the wiring layer and is parallel to the first main surface,
the plurality of drive wirings are unevenly arranged on one side of the second main surface from the first end portion toward the second end portion, and
the plurality of detection wirings are unevenly arranged on another side of the second main surface from the first end portion toward the second end portion.

(3) The sensor device according to (2), in which
the plurality of drive wirings and detection wirings are arranged in a line symmetry with one another using a center line of each of the plurality of coupling portions as a symmetrical axis and at regular intervals on the second main surface.

(4) The sensor device according to (2) or (3), in which
the plurality of detection wirings include
a first detection wiring connected to the first detection electrode, and
a second detection wiring connected to the second detection electrode, and
the detection wiring connected to one of the first and second detection electrodes having a larger electrode capacity is arranged adjacent to the plurality of drive wirings.

(5) The sensor device according to any one of (2) to (4), in which
the plurality of drive wirings include
a first drive wiring that is connected to the first drive electrode and to which a first drive signal is input, and
a second drive wiring that is connected to the second drive electrode and to which a second drive signal having an opposite phase from the first drive signal is input, and
the second drive wiring is arranged between the plurality of detection wirings and the first drive wiring at the plurality of coupling portions.

(6) The sensor device according to any one of (1) to (5), in which
the plurality of drive wirings and detection wirings are each formed of a material having a lower elastic modulus than the first and second drive electrodes and the first and second detection electrodes.

(7) The sensor device according to any one of (1) to (6), in which
the wiring layer further includes an organic film that covers the plurality of drive wirings and detection wirings.

(8) The sensor device according to any one of (1) to (7), in which
the frame includes
a set of first beams that extend in a second axis direction orthogonal to the first axis and oppose each other in a third axis direction orthogonal to each of the first and second axes,
a set of second beams that extend in the third axis direction and oppose each other in the second axis direction, and
4 connection portions that connect the first beams and the second beams,
the plurality of pendulum portions include 4 pendulum portions that protrude toward a center of the frame from the 4 connection portions, and
the plurality of coupling portions include 4 coupling portions that extend toward the base portion from the 4 connection portions.

(9) The sensor device according to (8), in which
the plurality of piezoelectric drive units include
a pair of first piezoelectric drive units that is respectively provided on the first main surface of the first beams and includes the first drive electrode as an upper electrode, and
a pair of second piezoelectric drive units that is respectively provided on the first main surface of the second beams and includes the second drive electrode as an upper electrode.

(10) The sensor device according to (8) or (9), in which
the plurality of first piezoelectric detection units include 4 piezoelectric detection units that are respectively provided on the first main surface of the 4 connection portions.

(11) The sensor device according to any one of (8) to (10), in which the plurality of second piezoelectric detection units include 4 piezoelectric detection units that are respectively provided on the 4 pendulum portions.

(12) The sensor device according to any one of (1) to (11), in which the plurality of coupling portions include an inversion portion where an extension direction is inverted between the vibrator unit and the base portion.

(13) A gyro sensor, including:
a vibrator unit including
an annular frame including a first main surface,
a plurality of pendulum portions each including one end portion supported by the frame,
a plurality of piezoelectric drive units that each include a piezoelectric film and first and second drive electrodes opposing each other while sandwiching the piezoelectric film and cause the frame to vibrate within a plane parallel to the first main surface,
a plurality of first piezoelectric detection units that each include a first detection electrode and detect an angular velocity about a first axis vertical to the first main surface on the basis of a deformation amount of the first main surface of the frame, and
a plurality of second piezoelectric detection units that each include a second detection electrode and detect angular velocities in biaxial directions orthogonal to the first axis on the basis of a deformation amount of the plurality of pendulum portions in a direction vertical to the first main surface;
an annular base portion that includes a plurality of terminal portions and is arranged around the vibrator unit;
a plurality of coupling portions that are arranged between the vibrator unit and the base portion and support the vibrator unit with respect to the base portion in a state where the vibrator unit is capable of vibrating;
a wiring layer including
a plurality of drive wirings that are respectively connected to the first and second drive electrodes while being adjacent and parallel to one another, and
a plurality of detection wirings that are respectively connected to the first and second detection electrodes while being adjacent and parallel to one another,
the wiring layer being provided at each of the plurality of coupling portions to electrically connect the plurality of terminal portions with the plurality of piezoelectric drive units, first piezoelectric detection units, and second piezoelectric detection units, respectively; and
a circuit device that supports the base portion and is electrically connected to the plurality of terminal portions.

(14) An electronic apparatus on which a gyro sensor is mounted, the gyro sensor including:
a vibrator unit including
an annular frame including a first main surface,
a plurality of pendulum portions each including one end portion supported by the frame,
a plurality of piezoelectric drive units that each include a piezoelectric film and first and second drive electrodes opposing each other while sandwiching the piezoelectric film and cause the frame to vibrate within a plane parallel to the first main surface,
a plurality of first piezoelectric detection units that each include a first detection electrode and detect an angular velocity about a first axis vertical to the first main surface on the basis of a deformation amount of the first main surface of the frame, and
a plurality of second piezoelectric detection units that each include a second detection electrode and detect angular velocities in biaxial directions orthogonal to the first axis on the basis of a deformation amount of the plurality of pendulum portions in a direction vertical to the first main surface;
an annular base portion that includes a plurality of terminal portions and is arranged around the vibrator unit;
a plurality of coupling portions that are arranged between the vibrator unit and the base portion and support the vibrator unit with respect to the base portion in a state where the vibrator unit is capable of vibrating;
a wiring layer including
a plurality of drive wirings that are respectively connected to the first and second drive electrodes while being adjacent and parallel to one another, and
a plurality of detection wirings that are respectively connected to the first and second detection electrodes while being adjacent and parallel to one another,
the wiring layer being provided at each of the plurality of coupling portions to electrically connect the plurality of terminal portions with the plurality of piezoelectric drive units, first piezoelectric detection units, and second piezoelectric detection units, respectively; and
a circuit device that supports the base portion and is electrically connected to the plurality of terminal portions.

REFERENCE SIGNS LIST 1 gyro sensor
10, 110 frame
10$s$ (first) main surface
11$a$, 11$b$ first beam
12$a$, 12$b$ second beam
13$a$-13$d$ connection portion
21$a$-21$d$ pendulum portion
31 first piezoelectric drive unit
32 second piezoelectric drive unit
51$a$-51$d$ first piezoelectric detection unit
71$a$-71$d$ second piezoelectric detection unit
81 base portion
82, 82$a$-82$d$ coupling portion
82$s$ (second) main surface
100 sensor device
101 vibrator unit
200 controller
810 terminal portion
D1, D2 first and second drive electrodes
S1, S2 first and second detection electrodes
La-Ld wiring layer
LD1, LD2 first and second drive wirings
LS1, LS2 first and second detection wirings

The invention claimed is:
1. A sensor device, comprising:
a vibrator unit that includes:
an annular frame including a first main surface;
a plurality of pendulum portions,
wherein a specific end portion of each of the plurality of pendulum portions is supported by the annular frame;
a plurality of piezoelectric drive units, wherein
each of the plurality of piezoelectric drive units includes a piezoelectric film, a first drive electrode, and a second drive electrode,
the first drive electrode is opposite to the second drive electrode,
the piezoelectric film is between the first drive electrode and the second drive electrode, and each of the plurality of piezoelectric drive units is configured to vibrate the annular frame within a plane parallel to the first main surface;

a plurality of first piezoelectric detection units, wherein
each of the plurality of first piezoelectric detection units includes a first detection electrode, and
each of the plurality of first piezoelectric detection units is configured to detect an angular velocity of the annular frame about a first axis direction vertical to the first main surface, based on a deformation amount of the first main surface of the annular frame; and a plurality of second piezoelectric detection units, wherein
each of the plurality of second piezoelectric detection units includes a second detection electrode, and
each of the plurality of second piezoelectric detection units is configured to detect angular velocities in biaxial directions orthogonal to the first axis direction, based on a deformation amount of the plurality of pendulum portions in the first axis direction vertical to the first main surface;

an annular base portion that includes a plurality of terminal portions,
wherein the annular base portion is arranged around the vibrator unit;

a plurality of coupling portions between the vibrator unit and the annular base portion,
wherein the plurality of coupling portions supports the vibrator unit with respect to the annular base portion; and a wiring layer that includes:
a plurality of drive wirings, wherein
a first drive wiring of the plurality of drive wirings is connected to the first drive electrode,
a second drive wiring of the plurality of drive wirings is connected to the second drive electrode, and
the first drive wiring is adjacent and parallel to the second drive wiring; and
a plurality of detection wirings, wherein
a first detection wiring of the plurality of detection wirings is connected to the first detection electrode,
a second detection wiring of the plurality of detection wirings is connected to the second detection electrode,
the first detection wiring is adjacent and parallel to the second detection wiring,
the wiring layer is on each of the plurality of coupling portions,
the wiring layer is configured to electrically connect the plurality of terminal portions with the plurality of piezoelectric drive units, the plurality of first piezoelectric detection units, and the plurality of second piezoelectric detection units, respectively,
an impedance of the second detection wiring is lower than an impedance of the first detection wiring, and
the second detection wiring is between the first detection wiring and the second drive wiring.

2. The sensor device according to claim 1, wherein each of the plurality of coupling portions includes:
a first end portion connected to the vibrator unit;
a second end portion connected to the annular base portion; and
a second main surface that supports the wiring layer,
the second main surface is parallel to the first main surface,
each of the plurality of drive wirings is arranged on a first side of the second main surface from the first end portion toward the second end portion, and
each of the plurality of detection wirings is arranged on a second side of the second main surface from the first end portion toward the second end portion.

3. The sensor device according to claim 2, wherein
the plurality of drive wirings and the plurality of detection wirings are arranged at regular intervals on the second main surface, and
a distance between the first detection wiring and a center line of a coupling portion of the plurality of coupling portions is same as a distance between the second drive wiring and the center line of the coupling portion.

4. The sensor device according to claim 2, wherein
the first drive wiring is configured to receive a first drive signal,
the second drive wiring is configured to receive a second drive signal having an opposite phase from the first drive signal, and
the second drive wiring is between the plurality of detection wirings and the first drive wiring at the plurality of coupling portions.

5. The sensor device according to claim 1, wherein the plurality of drive wirings and the plurality of detection wirings comprise a material having a lower elastic modulus than each of the first drive electrode, the second drive electrode, the first detection electrode, and the second detection electrode.

6. The sensor device according to claim 1, wherein the wiring layer further includes an organic film that covers the plurality of drive wirings and the plurality of detection wirings.

7. The sensor device according to claim 1, wherein the annular frame further includes:
a set of first beams that extends in a second axis direction orthogonal to the first axis direction,
wherein a first beam of the set of first beams and a second beam of the set of first beams oppose each other in a third axis direction orthogonal to each of the first axis direction and the second axis direction;
a set of second beams that extends in the third axis direction,
wherein a first beam of the set of second beams and a second beam of the set of second beams oppose each other in the second axis direction; and
four connection portions that connect the set of first beams and the set of second beams,
the plurality of pendulum portions includes four pendulum portions that protrude toward a center of the annular frame from the four connection portions, and
the plurality of coupling portions includes four coupling portions that extend toward the annular base portion from the four connection portions.

8. The sensor device according to claim 7, wherein the plurality of piezoelectric drive units further includes:
a pair of first piezoelectric drive units that is respectively on the first main surface of the set of first beams,
wherein the pair of first piezoelectric drive units includes the first drive electrode as a first upper electrode; and a pair of second piezoelectric drive units that is respectively on the first main surface of the set of second beams,
wherein the pair of second piezoelectric drive units includes the second drive electrode as a second upper electrode.

9. The sensor device according to claim 7, wherein the plurality of first piezoelectric detection units further includes four piezoelectric detection units that are respectively on the first main surface of the four connection portions.

10. The sensor device according to claim 7, wherein the plurality of second piezoelectric detection units further includes four piezoelectric detection units that are respectively on the four pendulum portions.

11. The sensor device according to claim 1, wherein the plurality of coupling portions includes an inversion portion where an extension direction of the plurality of coupling portions is inverted between the vibrator unit and the annular base portion.

12. A gyro sensor, comprising:
a vibrator unit that includes:
an annular frame including a first main surface;
a plurality of pendulum portions,
wherein an end portion of each of the plurality of pendulum portions is supported by the annular frame;
a plurality of piezoelectric drive units, wherein
each of the plurality of piezoelectric drive units includes a piezoelectric film, a first drive electrode, and a second drive electrode,
the first drive electrode is opposite to the second drive electrode,
the piezoelectric film is between the first drive electrode and the second drive electrode, and
each of the plurality of piezoelectric drive units is configured to vibrate the annular frame within a plane parallel to the main surface;
a plurality of first piezoelectric detection units, wherein
each of the plurality of first piezoelectric detection units includes a first detection electrode, and
each of the plurality of first piezoelectric detection units is configured to detect an angular velocity of the annular frame about a specific axis direction vertical to the main surface, based on a deformation amount of the main surface of the annular frame; and a plurality of second piezoelectric detection units, wherein
each of the plurality of second piezoelectric detection units includes a second detection electrode, and
each of the plurality of second piezoelectric detection units is configured to detect angular velocities in biaxial directions orthogonal to the specific axis direction, based on a deformation amount of the plurality of pendulum portions in the specific axis direction vertical to the main surface;
an annular base portion that includes a plurality of terminal portions,
wherein the annular base portion is arranged around the vibrator unit;
a plurality of coupling portions between the vibrator unit and the annular base portion,
wherein the plurality of coupling portions supports the vibrator unit with respect to the annular base portion;
a wiring layer that includes:
a plurality of drive wirings, wherein a first drive wiring of the plurality of drive wirings is connected to the first drive electrode,
a second drive wiring of the plurality of drive wirings is connected to the second drive electrode, and
the first drive wiring is adjacent and parallel to the second drive wiring; and
a plurality of detection wirings, wherein
a first detection wiring of the plurality of detection wirings is connected to the first detection electrode,
a second detection wiring of the plurality of detection wirings is connected to the second detection electrode,
the first detection wiring is adjacent and parallel to the second detection wiring,
the wiring layer is on each of the plurality of coupling portions,
the wiring layer is configured to electrically connect the plurality of terminal portions with the plurality of piezoelectric drive units, the plurality of first piezoelectric detection units, and the plurality of second piezoelectric detection units, respectively,
an impedance of the second detection wiring is lower than an impedance of the first detection wiring, and
the second detection wiring is between the first detection wiring and the second drive wiring; and
a circuit device that supports the annular base portion,
wherein the circuit device is electrically connected to the plurality of terminal portions.

13. An electronic apparatus, comprising:
a gyro sensor that includes:
a vibrator unit that includes:
an annular frame including a main surface;
a plurality of pendulum portions,
wherein an end portion of each of the plurality of pendulum portions is supported by the annular frame;
a plurality of piezoelectric drive units, wherein
each of the plurality of the piezoelectric drive units includes a piezoelectric film, a first drive electrode, and a second drive electrode,
the first drive electrode is opposite to the second drive electrode,
the piezoelectric film is between the first drive electrode and the second drive electrode, and
each of the plurality of piezoelectric drive units is configured to vibrate the annular frame within a plane parallel to the main surface;
a plurality of first piezoelectric detection units, wherein
each of the plurality of first piezoelectric detection units includes a first detection electrode, and
each of the plurality of first piezoelectric detection units is configured to detect an angular velocity of the annular frame about a specific axis direction vertical to the main surface, based on a deformation amount of the main surface of the annular frame; and
a plurality of second piezoelectric detection units, wherein
each of the plurality of second piezoelectric detection units includes a second detection electrode, and
each of the plurality of second piezoelectric detection units is configured to detect angular velocities in biaxial directions orthogonal to the specific axis direction, based on a deformation amount of the plurality of pendulum portions in the specific axis direction vertical to the main surface;

an annular base portion that includes a plurality of terminal portions,
   wherein the annular base portion is arranged around the vibrator unit;

a plurality of coupling portions between the vibrator unit and the annular base portion,
   wherein the plurality of coupling portions supports the vibrator unit with respect to the annular base portion;

a wiring layer that includes:
   a plurality of drive wirings, wherein
      a first drive wiring of the plurality of drive wirings is connected to the first drive electrode,
      a second drive wiring of the plurality of drive wirings is connected to the second drive electrode, and
      the first drive wiring is adjacent and parallel to the second drive wiring; and
   a plurality of detection wirings, wherein
      a first detection wiring of the plurality of detection wirings is connected to the first detection electrode,
      a second detection wiring of the plurality of detection wirings is connected to the second detection electrode,
      the first detection wiring is adjacent and parallel to the second detection wiring,
      the wiring layer is on each of the plurality of coupling portions,
      the wiring layer is configured to electrically connect the plurality of terminal portions with the plurality of piezoelectric drive units, the plurality of first piezoelectric detection units, and the plurality of second piezoelectric detection units, respectively,
      an impedance of the second detection wiring is lower than an impedance of the first detection wiring, and
      the second detection wiring is between the first detection wiring and the second drive wiring; and a circuit device that supports the annular base portion,
   wherein the circuit device is electrically connected to the plurality of terminal portions.

* * * * *